United States Patent
Waheed et al.

(10) Patent No.: US 9,020,454 B2
(45) Date of Patent: *Apr. 28, 2015

(54) LINEARIZATION AND CALIBRATION PREDISTORTION OF A DIGITALLY CONTROLLED POWER AMPLIFIER

(75) Inventors: Khurram Waheed, Plano, TX (US); Robert B. Staszewski, Garland, TX (US); Sameh S. Rezeq, Dallas, TX (US); Oren E. Eliezer, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/481,450

(22) Filed: May 25, 2012

(65) Prior Publication Data

US 2012/0263256 A1  Oct. 18, 2012

Related U.S. Application Data

(63) Continuation of application No. 11/675,582, filed on Feb. 15, 2007, now Pat. No. 8,195,103.

(60) Provisional application No. 60/773,775, filed on Feb. 15, 2006.

(51) Int. Cl.
*H04B 1/04* (2006.01)
(52) U.S. Cl.
CPC ...... *H04B 1/0475* (2013.01); *H04B 2001/0425* (2013.01)
(58) Field of Classification Search
USPC .............. 455/115.1, 115.2, 126, 114.3
See application file for complete search history.

(56) References Cited

U.S. PATENT DOCUMENTS

| | | | |
|---|---|---|---|
| 6,246,286 B1 * | 6/2001 | Persson | 330/149 |
| 6,809,598 B1 | 10/2004 | Staszewski et al. | |
| 7,415,250 B2 | 8/2008 | Sasaki et al. | |
| 7,496,334 B2 | 2/2009 | Saito | |
| 7,817,970 B2 * | 10/2010 | Puma | 455/114.3 |

(Continued)

OTHER PUBLICATIONS

"A Digital-To-RF-Amplitude Converter for GSM/GPRS/EDGE in 90-nm Digital CMOS", Patrick Cruise, et al., IEEE Radio Frequency Integrated Circuits Symposium, 2005, pp. 21-24.

(Continued)

*Primary Examiner* — Blane J Jackson
(74) *Attorney, Agent, or Firm* — Lawrence J. Bassuk; Frank D. Cimino

(57) ABSTRACT

An apparatus and method of linearization of a digitally-controlled pre-power amplifier (DPA) and RF power amplifier (PA) for performing predistortion calibration to compensate for nonlinearlities in the DPA and PA circuits. A predistortion look up table (LUT) stores measured distortion compensation data that is applied to the TX data before being input to the digital-to-frequency converter (DFC), DPA and PA. The on-chip receiver, which is normally inactive during the TX burst in a half-duplex operation, demodulates the RF PA output and uses the digital I/Q RX outputs to perform calibration of the TX pre-distortion tables. A sample of the RF output signal is provided to the receiver chain. While the PA (DPA) code is increasing (or decreasing), the amplitude and phase of the recovered I/Q samples are used to determine the instantaneous value of the AM/AM and AM/PM pre-distortion from which an update to the predistortion tables may be computed.

32 Claims, 18 Drawing Sheets

(56) References Cited

U.S. PATENT DOCUMENTS

| | | | |
|---|---|---|---|
| 2004/0151257 | A1 | 8/2004 | Staszewski et al. |
| 2005/0271161 | A1 | 12/2005 | Staszewski et al. |
| 2005/0287967 | A1 | 12/2005 | Hung et al. |
| 2006/0033582 | A1 | 2/2006 | Staszewski et al. |
| 2006/0038710 | A1 | 2/2006 | Staszewski et al. |
| 2009/0124219 | A1 | 5/2009 | Behzad |
| 2010/0233974 | A1* | 9/2010 | Nielsen .................. 455/114.3 |

OTHER PUBLICATIONS

"A Quad-Band 8PSK/GMSK Polar Transceiver", Alex W. Hietala, IEEE Journal of Solid-State Circuits, vol. 41, No. 5, May 2006, pp. 1133-1141.

"All-Digital TX Frequency Synthesizer and Discrete-Time Receiver for Bluetooth Radio in 130-nm CMOS", Robert Bogdan Staszewski, IEEE Journal of Solid-State Circuits, vol. 39, No. 12, Dec. 2004, pp. 2278-2291.

"Digitally Controlled Oscillator (DCO)-Based Architecture for RF Frequency Synthesis in a Deep-Submicrometer CMOS Process", Robert Bogdan Staszewski, et al., IEEE Transactions on Circuits and Systems—II: Analog and Digital Signal Processing, vol. 50, No. 11, Nov. 2003, pp. 815-828.

"Dynamic Deviation Reduction-Based Volterra Behavioral Modeling of RF Power Amplifiers", Anding Zhu, et al., IEEE Transactions on Microwave Theory and Techniques, vol. 54, No. 12, Dec. 2006, pp. 4323-4332.

"Quad-Band GSM/GPRS/EDGE Polar Loop Transmitter", Tirdad Sowlati, et al., IEEE Journal of Solid-State Circuits, vol. 39, No. 12, Dec. 2004, pp. 2179-2189.

* cited by examiner

LINEARIZATION AND CALIBRATION PREDISTORTION OF A DIGITALLY CONTROLLED POWER AMPLIFIER

REFERENCE TO PRIORITY APPLICATION

This application is a Continuation of application Ser. No. 11/675,582 filed Feb. 15, 2007 now U.S. Pat. No. 8,195,103, which claims priority to U.S. Provisional Application Ser. No. 60/773,775, filed Feb. 15, 2006, entitled "Linearization of an RF Power Amplifier", incorporated herein by reference in its entirety.

FIELD OF THE INVENTION

The present invention relates to the field of data communications and more particularly relates to an apparatus for and method of linearization of a transmit amplifier.

BACKGROUND OF THE INVENTION

Modern complex envelope modulation schemes such as those used in Enhanced Data rates for GSM Evolution (EDGE), Wideband Code Division Multiple Access (WCDMA), Bluetooth-Enhanced Data Rate (BT-EDR), Wireless Local Area Network (WLAN), Worldwide Interoperability for Microwave Access (WiMAX), etc. impose strict performance requirements on transceivers developed to support them, especially wireless handset transmitters. Stringent performance requirements for many aspects of polar transmitters exist as well. A circuit diagram illustrating an example prior art polar transmitter employing complex modulation based on direct phase and amplitude modulation is shown in FIG. 1. The circuit, generally referenced 10, comprises a coder 12, I and Q TX filters 14, 16, polar coordinate converter 18, local oscillator 20 and multiplier 22.

In operation, the bits $b_k$ to be transmitted are input to the coder, which functions to generate I (real) and Q (imaginary) symbols therefrom according to the targeted communications standard. The I and Q symbols are pulse-shaped and the resulting baseband signals are converted to phase (Ang$\{s(t)\}$), and magnitude (Mag$\{s(t)\}$) baseband signals by the polar coordinate converter 18. The phase data is used to control the local oscillator 20 to generate the appropriate frequency signal, which is multiplied in multiplier/mixer 22 by the magnitude data resulting in the output RF signal x(t). It is noted that this polar modulation scheme is better suited for digital implementation rather than analog implementation.

Linearization of an RF power amplifier (PA) and associated transmitter for complex modulation schemes, including EDGE, WCDMA, WLAN etc. is a daunting task. The varying amplitude of these modern transmission standards cause both amplitude (AM/AM) and phase (AM/PM) domain distortions which can potentially impact key transmitter parameters such as the signal constellation and the close-in modulation spectral mask. The distortions also cause spectral re-growth which results in reduced isolation with adjacent channels, i.e. adjacent channel power ratio (ACPR), adjacent channel leakage ratio (ACLR), etc. as well as causing increased noise due to system non-linearity. As a result, the effort to improve linearization is at the forefront of the modern cell phone design, as it is motivated by a need for higher power-added efficiency (PAE) and lower dissipated power resulting in improved cell phone battery life. Co-linearization of the RF power amplifier and associated transmitter results in superior transmitted signal characteristics causing a reduction of the overall bit error rate (BER) of the communication system. This results in robust wireless call quality and a reduction in the probability of calls being dropped.

A number of modern spectrally efficient enhanced data rate modulation techniques use both amplitude and phase/frequency modulations. Due to the large envelope fluctuations that are possible, such modulation schemes place additional linearity constraints on the transmitter devices. Transmitting modulated signals with high peak to average power ratio (PAR) through nonlinear devices causes undesired spectral re-growth and increases the resulting bit error rate (BER). Linearization of the power amplifiers within the transmitters is therefore required to meet the spectral requirements of many wireless standards. In addition, the nonlinear characteristics of such devices are known to vary significantly within the span of their lifetime due to temperature and voltage changes or aging of the device itself.

For RF power amplifiers, any amplitude, phase and time distortions can have a detrimental effect on the TX system performance. In the spectral domain, phase distortion of a complex signal can manifest itself in adjacent channel leakage (ACL) or adjacent channel leakage ratio (ACLR). In a complex vector domain, amplitude and phase distortions affect the complex modulation vector. This distortion is expressed as the error vector magnitude (EVM). All physical amplifiers contribute distortions such as random noise, phase noise, amplitude compression (AM/AM) and amplitude induced phase/delay variation (AM/PM). RF amplifiers used near the output of a cellular TX chain generate relatively smaller output power (i.e. <5 W) and are dominated by AM/AM and AM/PM distortion in their steady-state operation.

Linearization techniques to compensate for such distortion are known in the art as they are currently an area of extensive research in both academia and industry. Most prior art linearization methods fall into one of two categories: either open loop methods or closed loop methods. Both open and closed loop methods have advantages and disadvantages but neither on its own is satisfactory to be used in inexpensive and mass produced single chip radios.

One prior art open loop approach requires intensive characterization of the nonlinear elements across all contributing variables including process, voltage and temperature (PVT), aging, frequency of operation, output power-level and antenna load variations. Such characterization, however, is very time and resource consuming and is not sufficiently robust. In addition, the factory calibration time is quite long and expensive due to the need for a dedicated test bench, external test equipment and test time. Furthermore, this scheme typically requires, for example, extensive temperature characterization for possible compensation during regular operation. This creates the dilemma that the on-chip temperature measurements may not be accurate and may not be representative of the PA operating temperature. Moreover, this scheme offers no reprieve from the voltage standing wave ratio (VSWR) variations due to impedance mismatch variations between the PA output and the antenna typically caused by variations in the antenna surroundings.

One prior art closed loop predistortion method has the disadvantage of requiring sophisticated and very well balanced analog circuitry for wide bandwidth loops of orthogonal phase modulation (PM) and amplitude modulation (AM) paths. Not only does this scheme consume relatively large amounts of power, but it also is subject to failure in face of large interferers that appear at the antenna port. Furthermore, the precise analog delay and gain balancing required takes its toll on the overall yield that can be achieved by the scheme.

Unfortunately, both of the prior art linearization techniques referred to above (i.e. both open and closed loop) are not suitable for use with the low cost GSM/EDGE/3G cellular market targeted by the DRP™ based fully integrated cellular radios. These prior art linearization techniques necessitate the use of expensive test equipment and typically result in a disproportionate amount of test time for linearization in contrast to other transmitter tests. Further, these prior art approaches to linearization are not amenable to (1) ultra low cost factory testing using Very Low Cost Tester (VLCT) equipment which typically has limited RF stimulus and capture capabilities or to (2) taking advantage of built-in self test (BIST) techniques used for self calibration and automated (device and mode) failure testing.

Therefore, in general, there is a need for a linearization mechanism capable of linearization of an RF power amplifier and associated transmitter for complex modulation schemes that overcomes the disadvantages of the prior art schemes. The linearization scheme should be capable of operation in a DRP based single chip radio whereby it can take advantage of on-chip DRP resources to achieve efficient linearization of the power amplifier.

SUMMARY OF THE INVENTION

The present invention is a novel apparatus and method of linearization of a digitally controlled pre-power amplifier (DPA) and RF power amplifier (PA). The mechanism is operative to perform predistortion calibration to compensate for nonlinearities in the DPA and PA circuits. A predistortion look up table (LUT) stores measured distortion data that is applied to the TX data before it is input to the DPA and PA. The mechanism of the invention takes advantage of the on-chip receiver, which is normally inactive during the TX burst in a half-duplex operation, to demodulate the RF PA output and use the digital I/Q RX outputs to perform calibration of the PA pre-distortion tables. Controlled TX RF output coupling is used to provide a sample of the RF output signal that is input to the receiver chain.

The I and Q samples recovered from the receiver contain information about the amplitude and phase of the received signal. Distortion compensation data is derived from the recovered I and Q samples and used to update the entries in the predistortion LUT. The contents of the predistortion LUT are updated preferably during the PA power ramp, either up or down. While the digitally-controlled PA (DPA) code is increasing, the amplitude and phase of the I/Q samples are used to determine the instantaneous value of the AM/AM and AM/PM distortions and hence the corresponding required predistortion values to be stored in a look-up-table (LUT).

In one embodiment, the new values replace the existing values in the LUT. In an alternative embodiment, rather than overwrite the previous burst entries, a weighting or averaging function is applied to the new entries (or averaging) before they are written into the LUT. The predistortion table entries are populated with the particular codes used during the PA power ramp. The second option is to bypass the LNA and mixer stages and inject the PA power detect signal directly into the ADC.

The mechanism of the present invention is suitable for use in polar transmitter based systems, such as single-chip radio solutions based on the DRP technology. Such systems permit the use of existing on-chip DRP resources, such as the script processor and the receiver available in the time-division duplex (TDD) mode to achieve efficient PA linearization.

An advantage of the mechanism of the present invention is that it operates in a pseudo-closed-loop manner. It is operative to calculate the predistortion curves during the PA power ramp wherein the updated table is used during the entire burst. Alternatively, the mechanism of the present invention may also make use of samples of the output signal that are obtained during the data payload, since the instantaneous modulation (both phase and amplitude) are known to the transmitter and deviations from it caused by the AM/AM and AM/PM distortions may be determined through simple calculations. Since the existing on-chip RX resources are used for the evaluation of the distorted RF signal, no extra analog hardware is required. The resulting predistortion LUT is relatively small and the calculation is performed digitally, thus minimizing hardware requirements. Further, since the calculation may be performed on a well-behaved unmodulated signal during PA power ramp and remains constant, there is little sensitivity to an external interferer.

Note that many aspects of the invention described herein may be constructed as software objects that are executed in embedded devices as firmware, software objects that are executed as part of a software application on either an embedded or non-embedded computer system running a real-time operating system such as WinCE, Symbian, OSE, Embedded LINUX, etc. or non-real time operating system such as Windows, UNIX, LINUX, etc., or as soft core realized HDL circuits embodied in an Application Specific Integrated Circuit (ASIC) or Field Programmable Gate Array (FPGA), or as functionally equivalent discrete hardware components.

There is thus provided in accordance with the present invention, a method of linearization of a transmit amplifier, the method comprising the steps of scanning a plurality of power amplifier codes, generating a transmit amplifier output signal in accordance with each code scanned and determining one or more predistortion values in accordance with the transmit amplifier output signal.

There is also provided in accordance with the present invention, a method of compensating for predistortion of a transmit amplifier, the method comprising the steps of scanning a plurality of transmit amplifier codes, generating a transmit amplifier output signal in accordance with each code scanned, providing controlled leakage of the transmit amplifier output signal to a receiver chain operative to demodulate the transmit amplifier output signal to yield I and Q samples therefrom, calculating amplitude and phase distortion values in accordance with the I and Q samples and calibrating a predistortion table with the amplitude and phase distortion values.

There is further provided in accordance with the present invention, a method of predistortion calibration of a transmit amplifier, the method comprising the steps of stepping through a dynamic range of codes of the transmit amplifier, inputting each code to a transmit chain comprising a predistortion look up table (LUT) of transmit amplifier predistortion values to generate a radio frequency (RF) output signal in response thereto, demodulating the RF output signal to recover I and Q samples therefrom, calculating an instantaneous correction to the predistortion values stored in the predistortion LUT in accordance with the recovered I and Q values and updating the contents of the predistortion LUT in accordance with the calculated instantaneous correction.

There is also provided in accordance with the present invention, an apparatus for calibrating predistortion of a digitally controlled pre-power amplifier (DPA) and power amplifier (PA) comprising means for stepping through a range of codes of the DPA, a transmit chain comprising a predistortion look up table (LUT) adapted to store a plurality of amplifier predistortion values, the transmit chain operative to generate a radio frequency (RF) output signal in response to each code, means for coupling the RF output signal to a receiver chain, the receive chain operative to demodulate the RF output signal to generate recovered I and Q samples therefrom, means for calculating corrections to the predistortion values stored in the predistortion LUT in accordance with the recovered I and Q values and update means for updating the contents of the predistortion LUT in accordance with the calculated corrections.

There is also provided in accordance with the present invention, a method of hybrid linearization compensation for use in a transceiver, the method comprising the steps of first performing predistortion compensation during the ramp portion of a first end of a transmission burst to generate relative power level information feedback to update a predistortion look up table (LUT) thereby, second performing power control level (PCL) compensation during the ramp portion of a second end of the transmission burst to generate absolute power level information feedback and to update a power control LUT thereby and tracking changes in the power control LUT over an operational range of the transceiver in accordance with the relative power level information feedback and the absolute power level information feedback.

BRIEF DESCRIPTION OF THE DRAWINGS

The invention is herein described, by way of example only, with reference to the accompanying drawings, wherein.

DETAILED DESCRIPTION OF THE INVENTION

Notation Used Throughout

Figure 1:
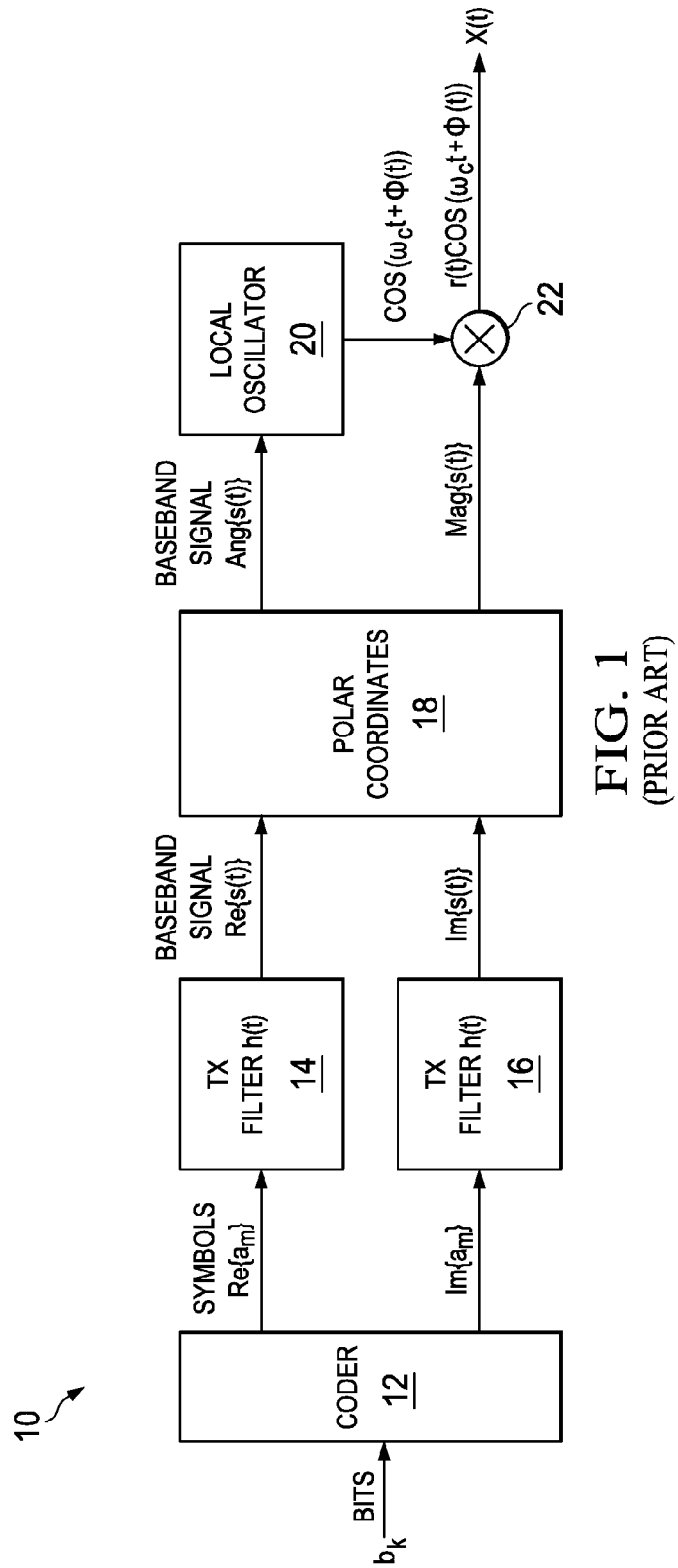
FIG. 1 is a block diagram illustrating a prior art complex polar modulator with direct phase and amplitude modulation.

The following notation is used throughout this document.

| Term | Definition |
| --- | --- |
| ACW | Amplitude Control Word |
| ACL | Adjacent Channel Leakage |
| ACLR | Adjacent Channel Leakage Ratio |
| ACPR | Adjacent Channel Power Ratio |
| ADC | Analog to Digital Converter |
| ADPLL | All Digital Phase Locked Loop |
| AM | Amplitude Modulation |
| ARM | Acorn RISC Machine |
| ASIC | Application Specific Integrated Circuit |
| BER | Bit Error Rate |
| BIST | Built-In Self Test |
| BT-EDR | Bluetooth-Extended Data Rate |
| CMOS | Complementary Metal Oxide Semiconductor |
| CORDIC | COordinate Rotation DIgital Computer |
| DAC | Digital to Analog Converter |
| DBB | Digital Baseband |
| DC | Direct Current |
| DCO | Digitally Controlled Oscillator |
| DCXO | Digitally Controlled Crystal Oscillator |
| DFC | Digital Frequency Conversion |
| DPA | Digital Power Amplifier |
| DRAC | Digital to RF Amplitude Conversion |
| DRP | Digital RF Processor or Digital Radio Processor |
| EDGE | Enhanced Data rates for GSM Evolution |
| EVM | Error Vector Magnitude |
| FCW | Frequency Command Word |
| FEM | Front End Module |
| FDD | Frequency Division Duplex |
| FM | Frequency Modulation |
| FPGA | Field Programmable Gate Array |
| FREF | Frequency Reference |
| GGE | GSM/GPRS/EDGE |
| GPRS | General Packet Radio Service |
| GSM | Global System for Mobile Communications |
| HDL | Hardware Description Language |
| IC | Integrated Circuit |
| IEEE | Institute of Electrical and Electronic Engineers |
| IIR | Infinite Impulse Response |
| IPM | Integrated Power Management |
| LDO | Low Drop Out |
| LNA | Low Noise Amplifier |
| LNTA | Low Noise Transconductance Amplifier |
| LO | Local Oscillator |
| LUT | Look-Up Table |
| MOS | Metal Oxide Semiconductor |
| PA | Power Amplifier |
| PAE | Power-Added Efficiency |
| PAR | Peak-To-Average Ratio |
| PCB | Printed Circuit Board |
| PCL | Power Control Level |

| Term | Definition |
|---|---|
| PLL | Phase Locked Loop |
| PM | Phase Modulation |
| PPA | Pre-Power Amplifier |
| PVT | Process Voltage Temperature |
| QAM | Quadrature Amplitude Modulation |
| RAM | Random Access Memory |
| RC | Raised Cosine |
| RCF | Rate Change Filter |
| RF | Radio Frequency |
| RFBIST | RF Built-In Self Test |
| RRC | Root Raised Cosine |
| RX | Receiver |
| SAW | Surface Acoustic Wave |
| SMPS | Switched Mode Power Supply |
| SoC | System on Chip |
| SPI | Serial Peripheral Interface |
| SRAM | Static Read Only Memory |
| TA | Transconductance Amplifier |
| TDD | Time Division Duplex |
| TRX | Transceiver |
| TX | Transmitter |
| VCO | Voltage Controlled Oscillator |
| VLCT | Very Low Cost Tester |
| VSWR | Voltage Standing Wave Ratio |
| WCDMA | Wideband Code Division Multiple Access |
| WiMAX | World Interoperability for Microwave Access |
| WLAN | Wireless Local Area Network |

DETAILED DESCRIPTION OF THE INVENTION

The present invention is a novel apparatus and method for the linearization of a transmit amplifier. The mechanism can be used to linearize a digitally controlled pre-power amplifier (DPA) and RF power amplifier (PA) incorporated in a polar transmitter. The mechanism is operative to perform predistortion calibration to compensate for nonlinearities in the DPA and PA circuits. A predistortion look-up-table (LUT) stores measured distortion data that is applied to the digitally represented TX signal before it is input to the DPA and PA. The mechanism of the invention takes advantage of the on-chip receiver, which is normally inactive during the TX burst in a half-duplex operation, to demodulate the RF PA output and use the digital I/Q RX outputs to perform calibration of the PA pre-distortion tables. Controlled RF coupling is used to provide a sample of the TX RF output signal that is input to the receiver chain.

The I and Q samples recovered from the receiver contain information about the amplitude and phase of the received signal. Distortion compensation data is derived from the recovered amplitude and phase of the RX I and Q samples. This in turn is used to update the entries in the predistortion LUT. The contents of the predistortion LUT are updated preferably during the PA power ramp, either up or down or both.

Alternatively, samples of the RX signal that are recorded during the payload transmission may also be used to evaluate the transmitter's distortion, since at every instance the nominal amplitude and phase modulations are known within the transceiver and can serve as references for comparison against the values sampled by the receiver.

The mechanism of the present invention is suitable for use in polar transmitter based systems, such as single-chip radio solutions based on the DRP technology. Such systems permit the use of existing on-chip DRP resources, such as the script processor and the receiver available in the time-division duplex (TDD) mode to achieve efficient PA linearization. Note that the invention is intended for use in a digital radio transceiver incorporating a polar transmitter but can be used in other applications as well, such as in a digital transmitter operating in Cartesian coordinates and in general communication channel and data converters.

To aid in understanding the principles of the present invention, the description is provided in the context of a digital RF processor (DRP) based transmitter that may be adapted to comply with a particular wireless communications standard such as GSM, GPRS, EDGE, Bluetooth, WCDMA, WLAN, WiMax, etc. It is appreciated, however, that the invention is not limited to use with any particular communication standard and may be used in optical, wired and wireless applications. Further, the invention is not limited to use with a specific modulation scheme but is applicable to any modulation scheme including both digital and analog modulations.

Note that throughout this document, the term communications device is defined as any apparatus or mechanism adapted to transmit, receive or both transmit and receive data through a medium. The communications device may be adapted to communicate over any suitable medium such as RF, wireless, infrared, optical, wired, microwave, etc. In the case of wireless communications, the communications device may comprise an RF transmitter, RF receiver, RF transceiver or any combination thereof. The notation DRP is intended to denote either a Digital RF Processor or Digital Radio Processor. References to a Digital RF Processor infer a reference to a Digital Radio Processor and vice versa.

Figure 2:
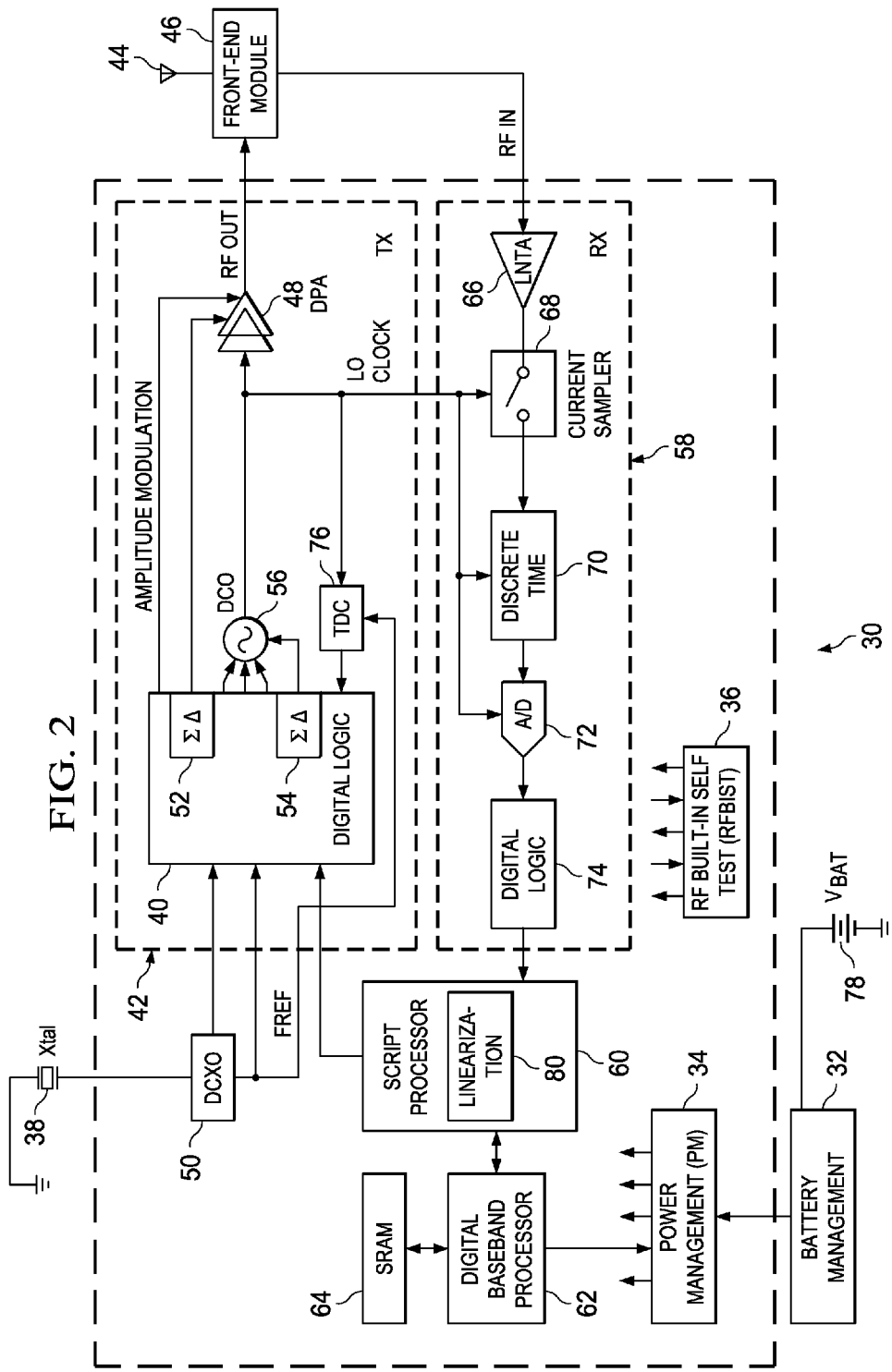
FIG. 2 is a block diagram illustrating a single chip polar transceiver radio incorporating an all-digital local oscillator based transmitter and receiver.

A block diagram illustrating a single chip polar transceiver radio incorporating an all-digital local oscillator based transmitter and receiver is shown in FIG. 2. For illustration purposes only, the transmitter, as shown, is adapted for the GSM/EDGE/WCDMA cellular standards. It is appreciated, however, that one skilled in the communication arts can adapt the transmitter illustrated herein to other modulations and communication standards as well without departing from the spirit and scope of the present invention.

The radio, generally referenced 30, comprises a script processor 60 adapted to execute the linearization mechanism of the present invention (represented as task block 80), digital baseband (DBB) processor 62, memory 64 (e.g., static RAM), TX block 42, RX block 58, crystal 38 and digitally controlled crystal oscillator (DCXO) 50, front-end module 46 and antenna 44, power management unit 34, RF built-in self test (BIST) 36, battery 78 and battery management circuit 32. The TX block comprises digital logic block 40 including EA modulators 52, 54, digitally controlled oscillator (DCO) 56 and digital power amplifier (DPA) 48. The RX block comprises a low noise transconductance amplifier 66, current sampler 68, discrete time processing block 70, analog to digital converter (ADC) 72 and digital logic block 74.

The principles presented herein have been used to develop multiple generations of a Digital RF Processor (DRP): single-chip Bluetooth, BT-EDR and GSM/EDGE radios realized in 130 nm and 90 nm digital CMOS process technologies, respectively. The common architecture is highlighted in FIG. 2 with features added specific to the cellular radio. The all-digital phase locked loop (ADPLL) based transmitter employs a polar architecture with all digital phase/frequency and amplitude modulation paths. The receiver employs a discrete-time architecture in which the RF signal is directly sampled and processed using analog and digital signal processing techniques.

A key component is the digitally controlled oscillator (DCO) 56, which avoids any analog tuning controls. A digitally-controlled crystal oscillator (DCXO) generates a high-quality base station-synchronized frequency reference such that the transmitted carrier frequencies and the received symbol rates are accurate to within 0.1 ppm. Digital logic built around the DCO realizes an all-digital PLL (ADPLL) that is used as a local oscillator for both the transmitter and receiver. Fine frequency resolution is achieved through high-speed ΣΔ dithering of its varactors. The polar transmitter architecture utilizes the wideband direct frequency modulation capability of the ADPLL and a digitally controlled power amplifier (DPA) 48 for the amplitude modulation. The DPA operates in near-class-E mode and uses an array of MOS transistor switches to regulate and/or modulate the RF amplitude. It is followed by a matching network and an external front-end module 46, which comprises a power amplifier (PA), a transmit/receive switch for the common antenna 44 and RX surface acoustic wave (SAW) filters. Fine amplitude resolution is achieved through high-speed ΣΔ dithering of the DPA nMOS transistors.

The receiver 58 employs a discrete-time architecture in which the RF signal is directly sampled at a high rate corresponding to the RF carrier frequency and processed using analog and digital signal processing techniques. The transceiver is integrated with a script processor 60, dedicated digital base band processor 62 (i.e. ARM family processor) and SRAM memory 64. The script processor handles various TX and RX calibration, compensation, sequencing and lower-rate data path tasks and encapsulates the transceiver complexity in order to present a much simpler software programming model.

The frequency reference (FREF) is generated on-chip by a 26 MHz digitally controlled crystal oscillator (DCXO) 50. An integrated power management (IPM) system is connected to an external battery management circuit 32 that conditions and stabilizes the supply voltage. The IPM comprises multiple low drop out (LDO) regulators that provide internal supply voltages and also isolate supply noise between circuits, especially protecting the DCO. The RF built-in self-test (RFBIST) 36 performs autonomous phase noise and modulation distortion testing as well as various loopback configurations for the testing of receiver and transmitter functions. The transceiver is integrated with the digital baseband and SRAM memory in a complete system-on-chip (SoC) solution. Almost all the clocks on this SoC are derived from and are synchronous to the RF oscillator clock. This helps to reduce susceptibility to the noise generated through clocking of the massive digital logic.

The transmitter comprises a polar architecture in which the amplitude and phase/frequency modulations are implemented in separate paths. Transmitted symbols generated in the digital baseband (DBB) processor are first pulse-shape filtered in the Cartesian coordinate system. The filtered in-phase (I) and quadrature (Q) samples are then converted through a CORDIC algorithm into amplitude and phase samples of the polar coordinate system, while maintaining a sufficiently high sampling rate to accommodate the bandwidth widening caused by the Cartesian-to-polar non-linear transformation. The phase is then differentiated to obtain frequency deviation, which is the input control signal to be fed to the digital frequency modulator or digital to frequency converter (DFC). The polar signals are subsequently conditioned through signal processing to sufficiently increase the sampling rate in order to reduce the quantization noise density and lessen the effects of the modulating spectrum replicas.

A more detailed description of the operation of the ADPLL can be found in U.S. Patent Publication No. 2006/0033582A1, published Feb. 16, 2006, to Staszewski et al., entitled "Gain Calibration of a Digital Controlled Oscillator," U.S. Patent Publication No. 2006/0038710A1, published Feb. 23, 2006, Staszewski et al., entitled "Hybrid Polar/Cartesian Digital Modulator" and U.S. Pat. No. 6,809,598, to Staszewski et al., entitled "Hybrid Of Predictive And Closed-Loop Phase-Domain Digital PLL Architecture," all of which are incorporated herein by reference in their entirety.

RF Polar Transmitter in Deep-Submicron CMOS

Figure 3:
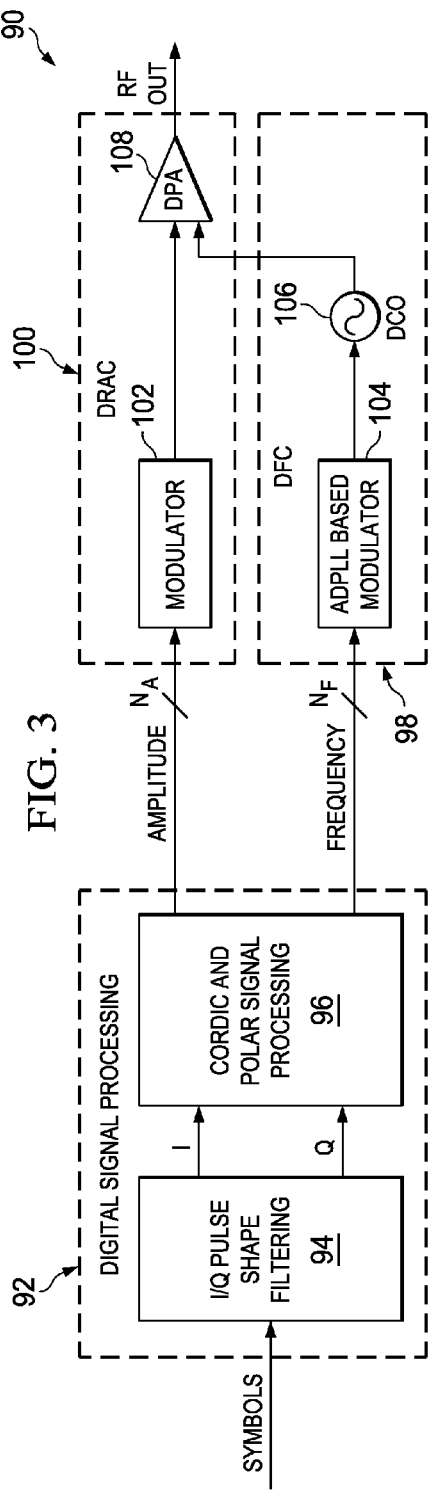
FIG. 3 is a block diagram illustrating a single chip polar transmitter based on a DCO and digitally controlled power amplifier (DPA) circuits.

A block diagram illustrating a single chip polar transmitter based on a DCO and digitally controlled power amplifier (DPA) circuits is shown in FIG. 3. The transmitter, generally referenced 90, comprises a digital signal processor block 92, digital to frequency converter (DFC) 98 and digital to RF amplitude converter (DRAC) 100. The DSP block 92 comprises I/Q pulse shaping filtering 94 and CORDIC polar signal processing 96. The DFC comprises an ADPLL based phase/frequency modulator 104 and DCO 106. The DRAC comprises an amplitude modulator 102 and digital power amplifier (DPA) 108.

A paradigm facing analog and RF designers of deep submicron CMOS circuits is that in a deep-submicron CMOS process, time-domain resolution of a digital signal edge transition is superior to voltage resolution of analog signals. A successful design approach in this environment would be to exploit the paradigm by emphasizing (1) fast switching characteristics or high $f_T$ (40 ps and 100 GHz in this process, respectively) of MOS transistors: high-speed clocks and/or fine control of timing transitions; (2) high density of digital logic (e.g., 250 kgates/mm$^2$ in 90 nm process) making digital functions extremely inexpensive; and (3) small device geometries and precise device matching made possible by the fine lithography, while avoiding (1) biasing currents that are commonly used in analog designs; (2) reliance on voltage resolution; and (3) nonstandard devices that are not needed for memory and digital circuits.

FIG. 3 illustrates an application of the new paradigm to an RF wireless transmitter performing arbitrary complex modulation based on orthogonal modulation paths for amplitude and phase/frequency. The low cost of digital logic allows for the use of sophisticated digital signal processing techniques. The tiny and well matched devices allow for precise and high-resolution conversions from digital to analog domains. The use of ultra high-speed clocks, i.e. high oversampling ratios, can eliminate the need for subsequent dedicated reconstruction filtering to suppress spectral replicas and switching transients, so that only the natural filtering of an oscillator (1/s due to the frequency-to-phase conversion), the coarse matching network of the power amplifier and antenna filter are relied upon.

Since the converters utilize DCO clocks that are of high spectral purity, the sampling jitter is very small. The sampling jitter is not significantly affected by modulation, since the jitter due to modulation is not greater than the oscillator thermal jitter. The conversion functions presented herein are phase/frequency and amplitude modulations of an RF carrier realized using digitally-controlled oscillator (DCO) and digitally-controlled power amplifier (DPA) circuits, respectively. They are digitally-intensive equivalents of the conventional voltage-controlled oscillator (VCO) and power amplifier driver circuits.

Due to the fine feature size and high switching speed of modern CMOS technology, the respective digital-to-frequency conversion (DFC) and a portion of the digital-to-RF-amplitude conversion (DRAC) curves can be made very linear and of high dynamic range. The frequency deviation output signal is fed into the DCO-based $B_F$-bit DFC, which produces the phase modulated (PM) digital carrier:

$$y_{PM}(t)=sgn(\cos(\omega_0 t+\theta[k])) \quad (1)$$

where
sgn(x)=1 for x≥0;
sgn(x)=−1 for x<0;
$\omega_0=2\pi f_0$ is the angular RF carrier frequency;
θ[k] is the modulating baseband phase of the $k^{th}$ sample;
The phase $\theta(t)=2\pi\int_{-\infty}^{t}f(t)dt$ is an integral of frequency deviation, where $t=k\cdot T_0$ with $T_0$ being the sampling period represented in $B_F=I_F+F_F$ bits, $I_F$ and $F_F$ being integer and fractional bits respectively.

The amplitude modulation (AM) signal controls the envelope of the phase-modulated carrier by means of the DPA based $B_A$-bit DRAC. Higher-order harmonics of the digital carrier are filtered out by a matching network so that the sgn( ) operator is dropped. The composite DPA output contains the desired RF output spectrum.

$$y_{RF}(t)=a[k]\cdot\cos(\omega_0 t+\theta[k]) \quad (2)$$

where a[k] is the modulating baseband amplitude of the $k^{th}$ sample. The amplitude is represented in $B_A=I_A+F_A$ bits, $I_A$ and $F_A$ being integer and fractional bits respectively.

Despite their commonalities there are important differences between the two conversion functions. Due to the narrowband nature of the communication system, the DFC operational dynamic range is small but with a fine resolution. The DRAC operating range, on the other hand, is almost full scale, but not as precise. In addition, the phase modulating path features an additional 1/s filtering caused by the frequency-to-phase conversion of the oscillator. The signal processing and delay between the AM and PM paths must be matched, otherwise the recombined composite signal will be distorted. Matching invariability to the process, voltage and temperature (PVT) changes, however, is guaranteed by the clock-cycle accurate characteristics of digital circuits. The group delay of the DCO and DPA circuits is relatively small (e.g., tens of picoseconds due to the high $f_T$ of the deep-submicron CMOS devices) in comparison with the tolerable range (tens of nanoseconds).

The DFC and DRAC are key functions of the all-digital transmitter that does not use any current biasing or dedicated analog continuous-time filtering in the signal path. In order to improve matching, linearity, switching noise and operational speed, the operating conversion cells (i.e. bit to frequency or RF carrier amplitude) are mainly realized as unit weighted. Due to the excellent device matching characteristics in a deep-submicron CMOS process, it is relatively easy to guarantee at least 7-bit conversion resolution in one iteration cycle without resorting to elaborate layout schemes. The DFC and DRAC architectures are presented infra.

Figure 4:
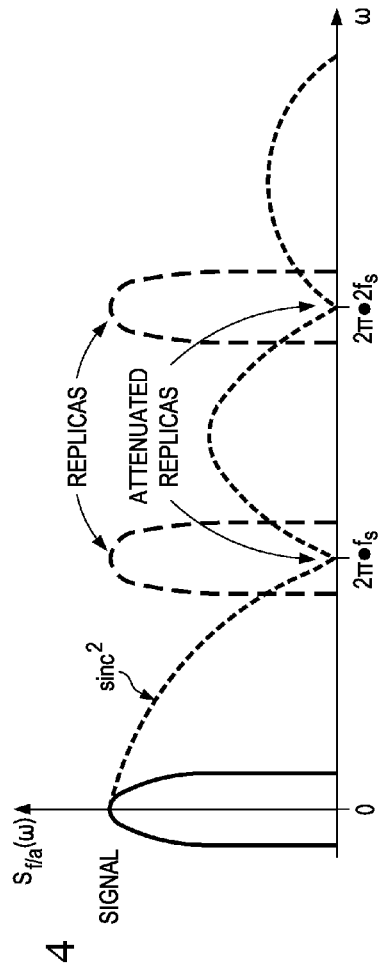
FIG. 4 is a diagram illustrating spectral replicas of a modulating signal and associated filtering through a zero-order hold.

Spectral replicas of the discrete-time modulating signal appear at the DCO and DPA inputs at integer multiples of the sampling rate frequency $f_s$, as shown in FIG. 4. They are attenuated through multiplication with the sinc² function due to the zero-order hold at the DFC/DPA input. The frequency spectrum $S_f(\omega)$ replicas are further attenuated by 6 dB/octave through the 1/s operation of the oscillator to finally appear at the RF output phase spectrum $S_\phi(\omega)$. The sampling rate $f_s$ is chosen to be high enough for the replicas to be sufficiently attenuated, thus making the RF signal undistinguishable from that created by the conventional transmitters with continuous-time filtering at baseband.

With reference to FIG. 3, the Digital Radio Processor (DRP™) based polar transmitter 90 uses a power efficient nonlinear digital to RF amplitude converter (DRAC) 100 as the final transmitter stage for combining both amplitude and phase modulations. The phase modulation is produced by a digitally controlled oscillator (DCO) which is modulated using the two-point based all-digital phase locked loop (ADPLL) 104. The DPA is a source of a significant level of AM/AM and AM/PM distortions even at low powers. The transmitter typically feeds into an external linear power amplifier (PA), which also exhibits compression and phase fluctuations as a function of the output power level. These distortions are functions of the process, voltage and temperature (PVT), device aging, frequency of operation and the output power-level.

In accordance with the present invention, digital predistortion of the amplitude and phase modulation is performed in order to mitigate the distortions introduced by the DPA and the RF PA. Digital predistortion is the mechanism whereby the complex input modulation signals (e.g., amplitude modulation (ρ) and phase modulation (θ) in the case of a polar transmitter) are digitally altered to counter the nonlinear artifacts introduced by the digitally controlled pre-power amplifier (DPA) and power amplifier (PA).

Figure 5:
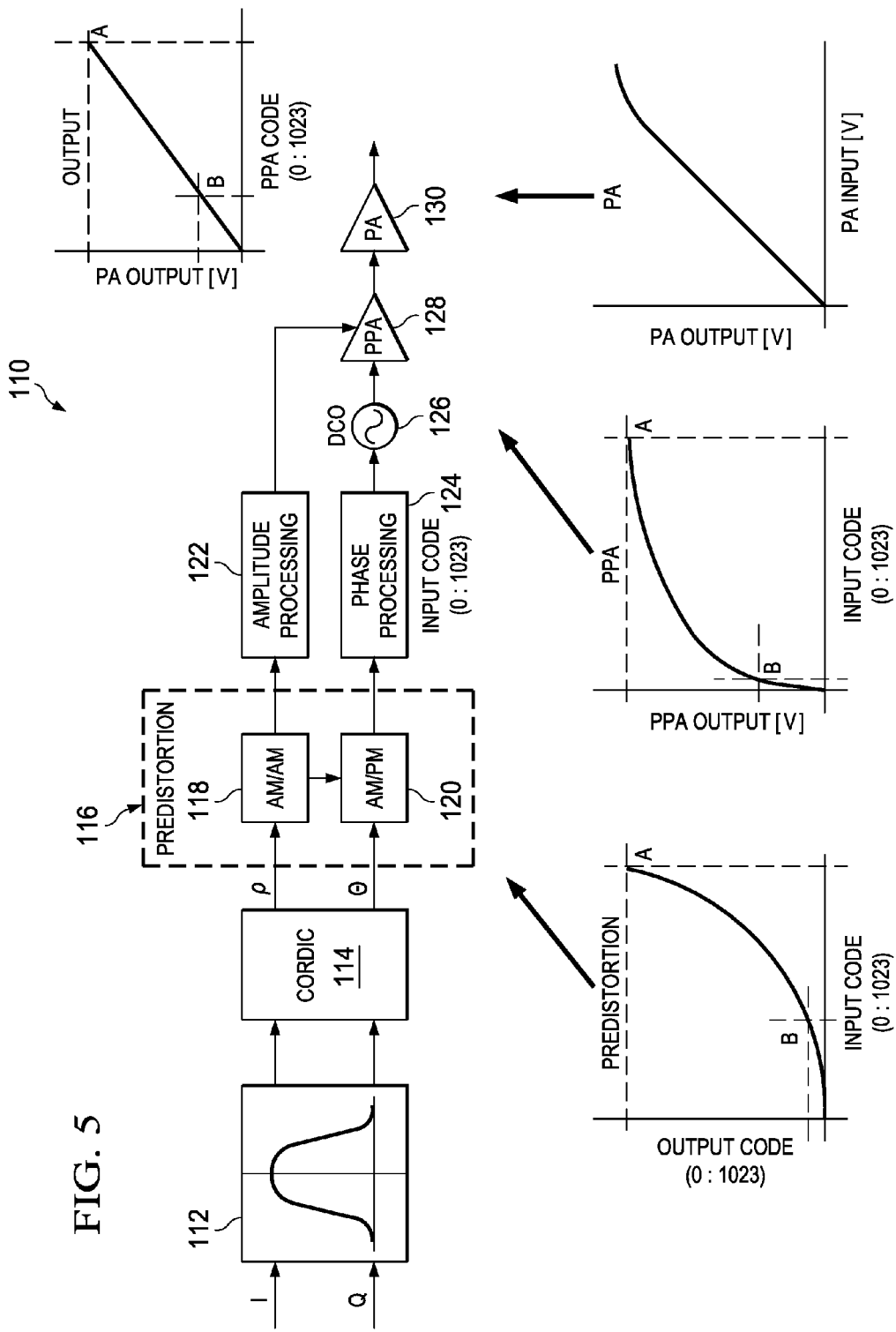
FIG. 5 is a block diagram illustrating co-linearization of a DRP based transmitter and RF power amplifier.

A block diagram illustrating co-linearization of a DRP based transmitter and RF power amplifier is shown in FIG. 5. The circuit shown is an illustrative example of digital predistortion as applied to a polar transmitter. The transmitter, generally referenced 110, comprises a transmit pulse shaping filter 112, CORDIC 114, predistortion block 116 comprising AM/AM predistortion 118 and AM/PM predistortion 120, amplitude processing 122, phase processing 124, DCO 126, pre-power amplifier (PPA) 128 and power amplifier (PA) 130.

Figure 6:
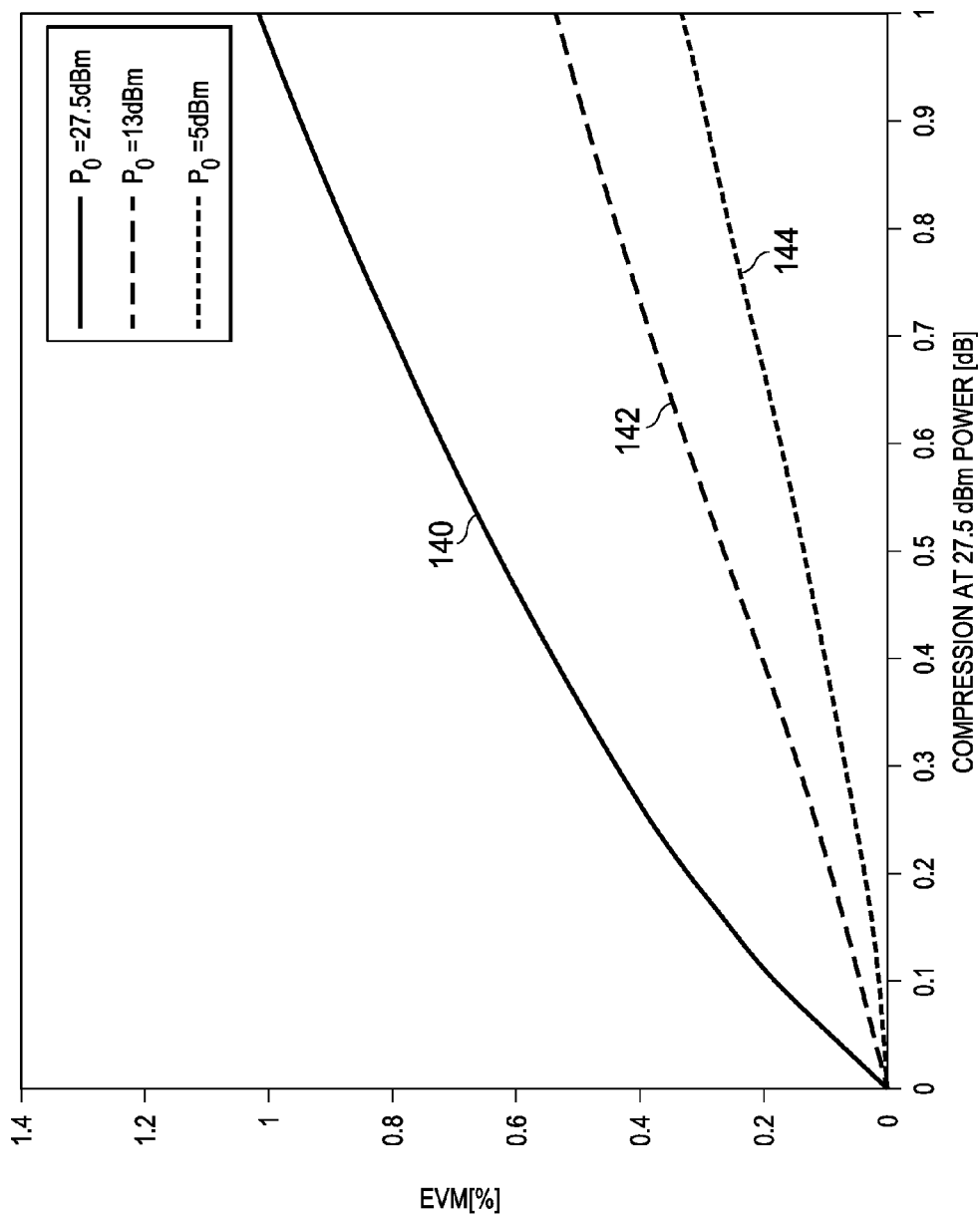
FIG. 6 is a graph illustrating the degradation in EVM in an EDGE transmitter as a function of RF power amplifier compression.
Figure 7:
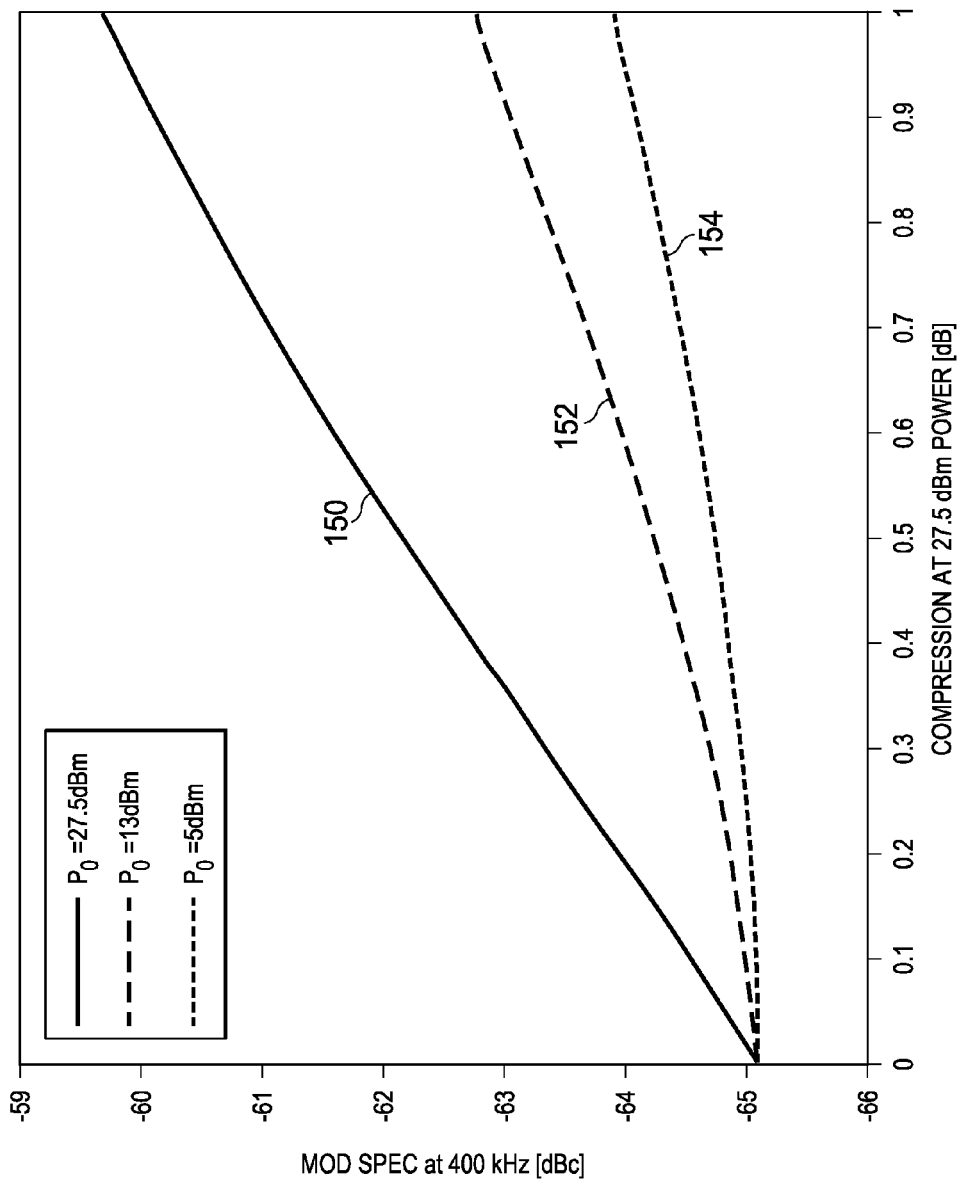
FIG. 7 is a graph illustrating the degradation in modulated spectrum at 400 kHz offset in an EDGE transmitter as a function of RF power amplifier compression.

The quantitative impact of RF PA compression is shown in FIGS. 6 and 7. FIG. 6 illustrates the degradation in EVM in an EDGE transmitter as a function of RF power amplifier compression while FIG. 7 illustrates the degradation in modulated spectrum at 400 kHz offset in an EDGE transmitter as a function of RF power amplifier compression. Regarding FIG. 6, trace 140 represents an output power level of 27.5 dBm; trace 142 represents an output power level of 13 dBm and trace 144 represents an output power level of 5 dBm.

It is observed that for an EDGE TX, at higher PA output powers, the modulated spectrum at 400 kHz offset degrades rapidly as compression is introduced in the PA. The TX error vector magnitude (EVM) seems to be relatively less sensitive to the PA compression but the PA compression at relatively higher output levels results in noticeable degradation of the TX performance.

Figure 8:
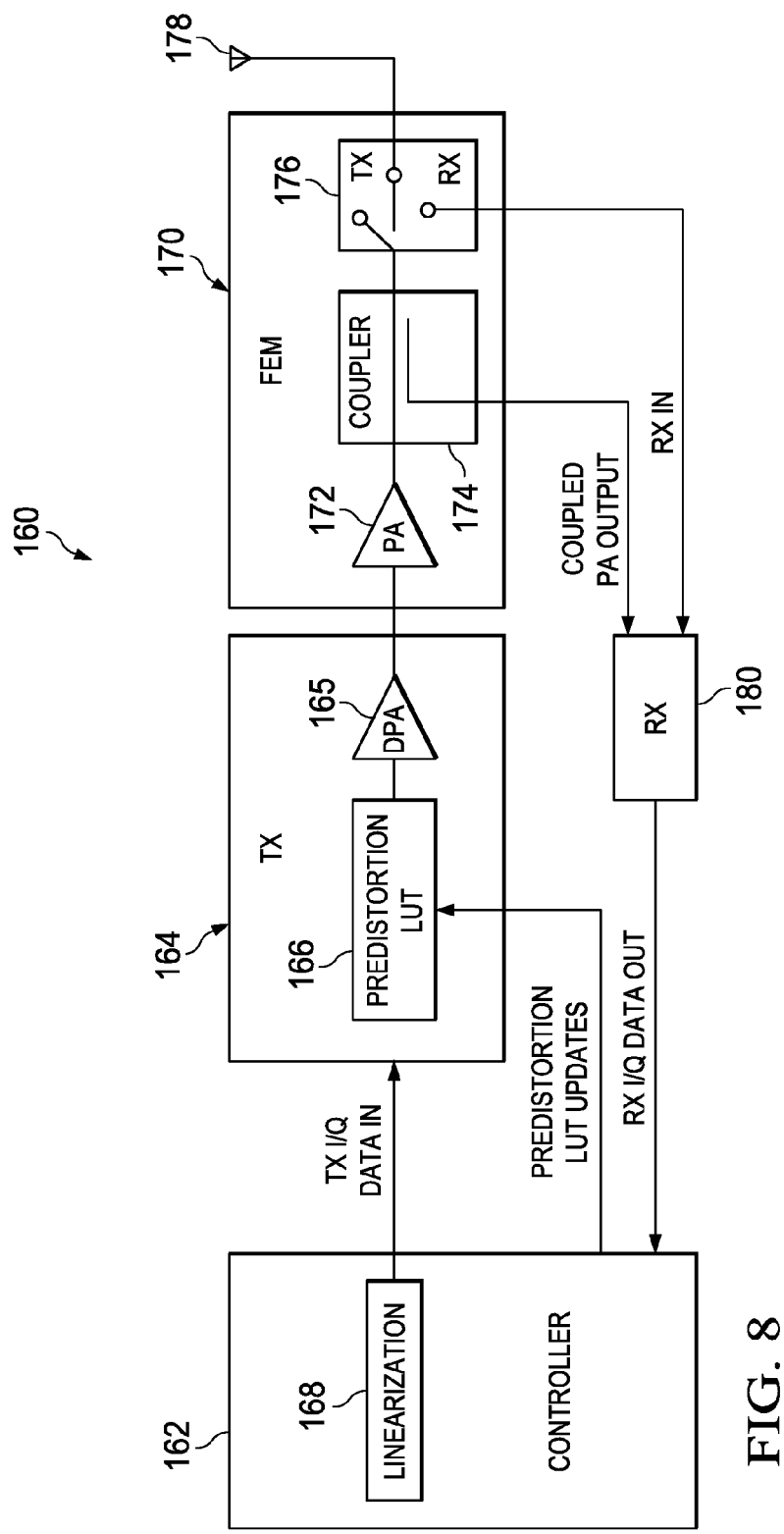
FIG. 8 is a block diagram illustrating the general linearization mechanism of the present invention.

A block diagram illustrating the general linearization mechanism of the present invention is shown in FIG. 8. the linearization scheme, generally referenced 160, comprises a controller or processor 162 adapted to execute application code 168 implementing the linearization mechanism of the present invention, a transmitter chain 164 incorporating a predistortion look up table (LUT) and digitally controlled pre-power amplifier (DPA) 165, receiver chain 180 power amplifier front-end module 170 comprising a power amplifier 172, signal coupler 174 and RF switch 176, and antenna 178. A flow diagram illustrating the predistortion LUT update method of the present invention is shown in FIG. 11.

Figure 11:
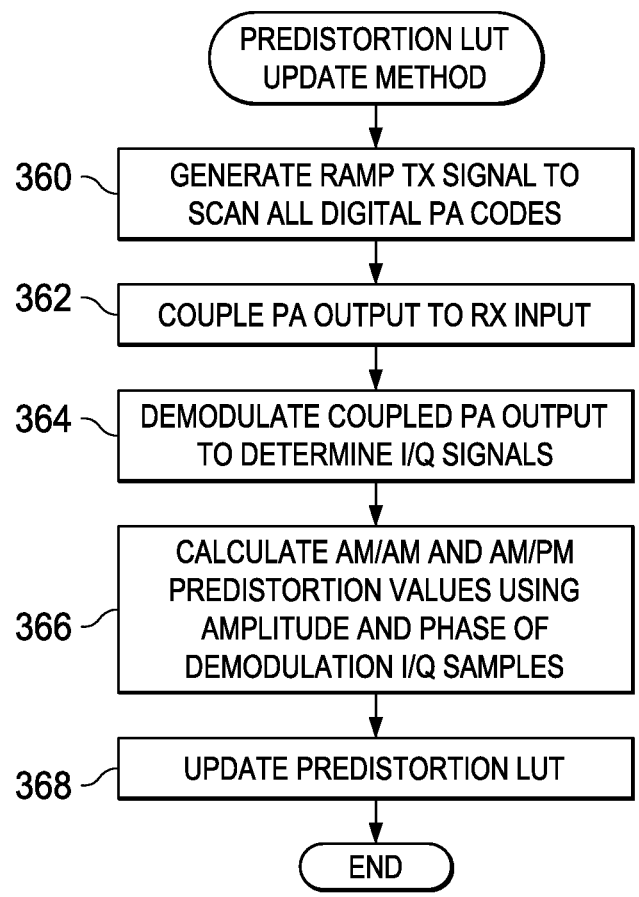
FIG. 11 is a flow diagram illustrating the predistortion LUT update method of the present invention.

With reference to FIGS. 8 and 11, in accordance with the present invention, during operation the controller scans through the dynamic range of codes of the DPA (step 360). For each code, TX I/Q data is generated and input to the TX 164. Assuming the predistortion LUT has not been populated yet as is the case during IC manufacture, the TX data is translated by the DPA into a TX output signal having a certain amplitude. The TX output signal is input to the FEM which functions to amplify the input signal to generate an RF output signal.

In order to characterize the distortion introduced by the DPA and the power amplifier, the RF output signal is fed back to the RX chain via coupler 174 (step 362). The manner of coupling of the RF output signal may be implemented using suitable means and is not critical to the invention. The coupled RF output signal is demodulated by the RX chain and the I and Q samples are recovered (step 364). The recovered I and Q samples are processed by the controller to generate the amplitude (AM/AM) and phase (AM/PM) distortion values (step 366). The distortion values are then used to compute and populate the predistortion LUT (step 368).

After manufacture and during operation of the chip, the contents of the predistortion LUT are updated by closing the loop to generate correction values. The correction values are used to dynamically update the contents of the predistortion LUT. In the case of GGE (GSM/GPRS/EDGE) systems, the updates preferably occur during the ramp up or ramp down of the GGE burst transmission. Generating the correction values is crucial to compensating for variations in operating characteristics such as temperature, battery voltage, frequency of operation and variations in antenna load causing VSWR.

Figure 9A:
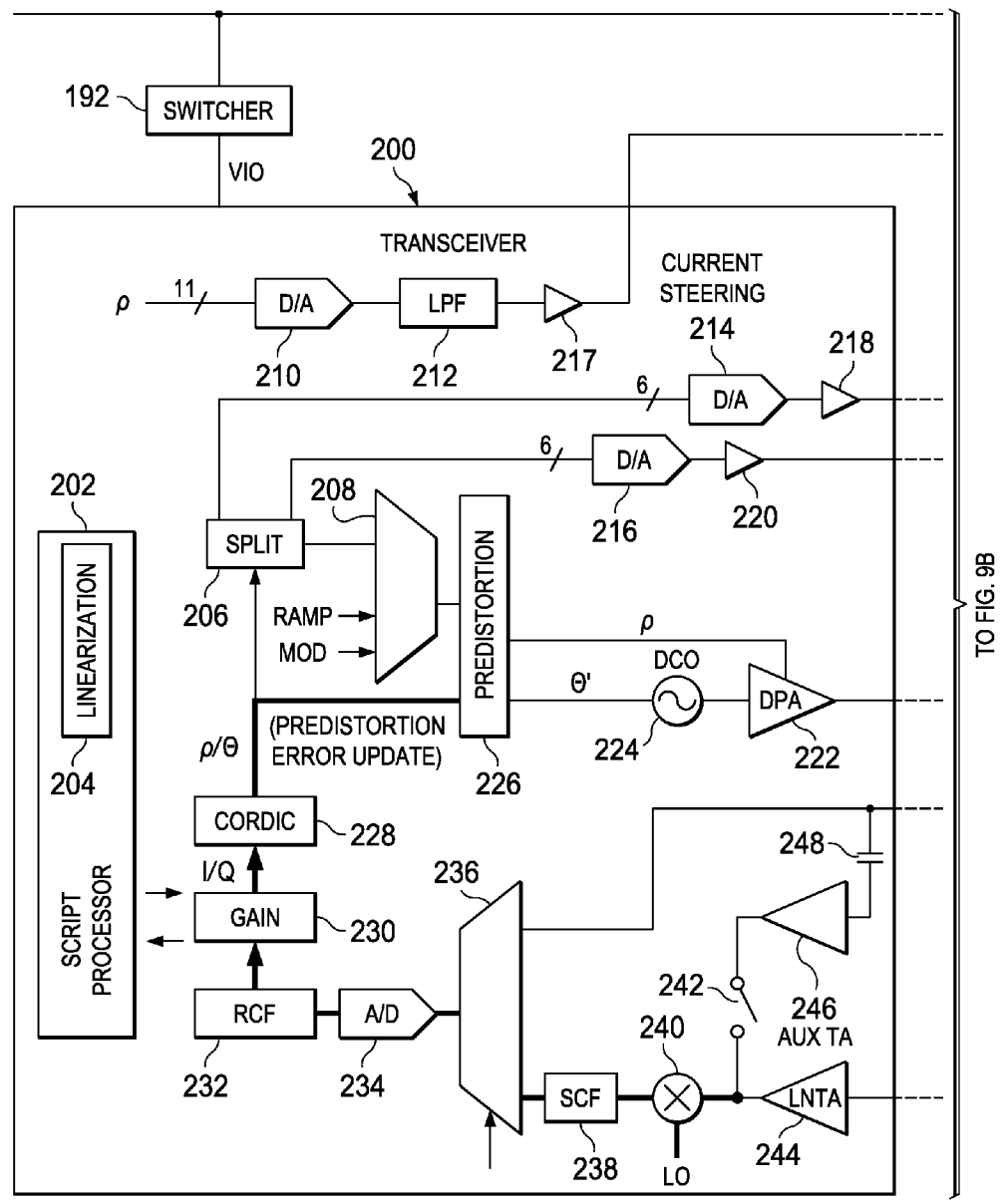
FIG. 9 is a block diagram illustrating a first embodiment of the linearization mechanism of the present invention implemented in a DRP based GSM/EDGE polar transmitter.
Figure 9B:
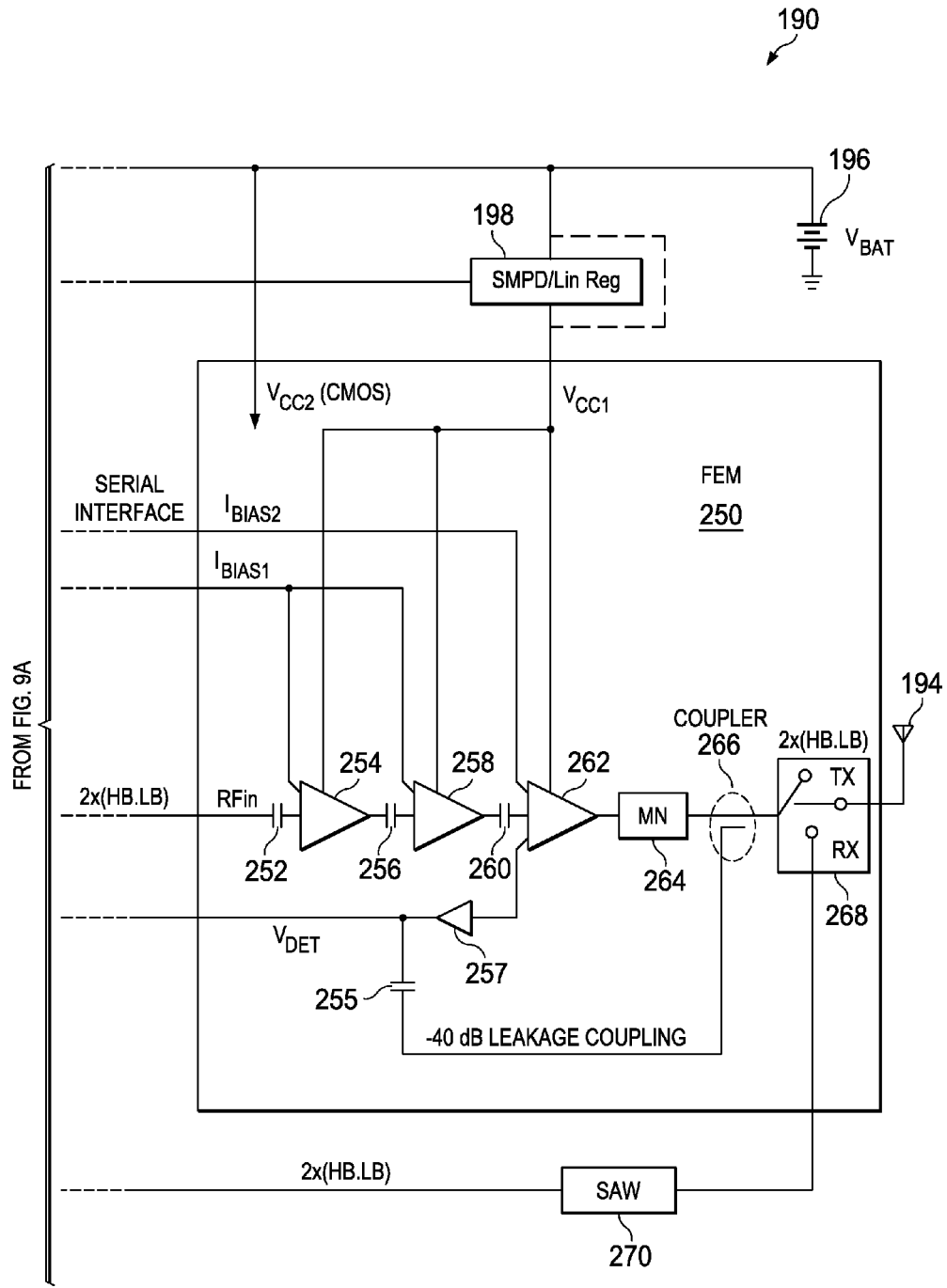

A block diagram illustrating a first embodiment of the linearization mechanism of the present invention implemented in a DRP based GSM/EDGE polar transmitter is shown in FIG. 9. The example polar transmitter, generally referenced 190, comprises a transceiver circuit 200, front end module (FEM) 250, SAW filter 270, antenna 194, switcher/regulator 192, switched mode power supply (SMPS) or linear regulator 198 and battery 196. The transceiver comprises a script processor 202 (or other controller/processor device) incorporating program code means 204 for implementing the linearization mechanism of the present invention, CORDIC 228, splitter 206, multiplexers 208, 236, predistortion LUT 226, DCO 224, DPA 222, coupling capacitor 248, auxiliary low noise amplifier (LNA)/transconductance amplifier (TA) 246, low noise transconductance amplifier (LNTA) 244, switch 242, mixer 240, filters 238, 232, 212, ADC 234, gain block 230, DACs 210, 214, 216 and buffers 218, 220. 217. The FEM comprises capacitors 252, 256, 260, 255, amplifiers 254, 258, 262, signal coupler 266, buffer 257, matching network (MN) 264 and RF switch 268.

The linearization mechanism of the present invention employs a quasi-closed loop approach to linearization whereby the best traits of both open and closed loop schemes are combined. The initial predistortion is based on a calibration scheme augmented by the feedback generated from the output of the PA (or the DPA), which is utilized in a time sliced manner. This is beneficial especially for a polar GSM/GPRS/EDGE (GGE) DRP based transmitter since the feedback is generated using the on-chip receiver (RX) in a TDD manner. It should be noted that in FDD systems, where the transmission and reception are simultaneous, such as in WCMDA, the invention may apply by dedicating separate additional hardware for the reception of the transmitted signal for the sake of evaluating the distortions experienced in it.

The transmitter circuit 190 comprises multiple closed loops which are created by the wiring between different components of the transceiver (TRX) 200 (which comprises a polar transmitter and an I/Q receiver), front end module (FEM) 250 (which comprises the power amplifier (PA) and the switch fabric before the antenna), a switcher/regulator 192 between the battery and the TRX, a regulator or a switched mode power supply (SMPS) 198 for efficiency enhancement of the FEM and an external RX SAW filter 290. A description of the various signals and loops is presented below.

The transmitter shown in the TRX is a small-signal polar transmitter described in more detail in the ADPLL references cited supra, where the digital baseband (DBB) GGE modulation signal undergoes a polar transformation through a CORDIC 228 to convert from the I/Q to the amplitude modulating ($\rho$) and the phase modulating ($\theta$) signals. The $\rho$/$\theta$ components of the modulation get predistorted digitally via predistortion LUT 226 before the $\theta$ signal modulates the DCO 224 using an all-digital two point modulation. The phase modulated output of the DCO is amplitude modulated by the $\rho$ in the DPA 222. The composite RF signal is then fed to the FEM.

Alternatively, the TRX also supports the large signal polar modulation scheme wherein the amplitude signal ($\rho$) is combined with the phase modulation in the PA instead of the DPA. In this mode, the $\rho$ input to the DPA is kept constant. Such a mode is supported for polar PA based FEMs. In an efficiency enhanced mode FEM, the $\rho$ signal undergoes amplitude modulation in the PA using a high-frequency switching regulator. For the legacy FEM/PA solutions, however, the signal may undergo amplitude modulation using the collector (or drain) of the PA transistors.

The path through the SAW filter comprises the regular RX signal from the FEM to the GGE RX. For TDD GGE systems, the TX/RX switch in this mode is connected to the RX pole. The RX signal is input to the I/Q low noise transconductance amplifier (LNTA) 244 and down-converted by a quadrature mixer 240. The mixer output is analog filtered 238 after which it is digitized via a $\Sigma\Delta$ ADC 234. The ADC output is heavily filtered 232, equalized and compensated for any I/Q mismatches and DC offsets after which it is appropriately normalized in gain block 230 to enable the comparison of the received signal with the nominal amplitude and phase of an ideal TX signal, thus determining the distortions in these two.

The $V_{DET}$ pin at the FEM is multiplexed or 'wired-or' for the power detector output as well as the RF coupler feedback of the PA signal within the FEM. When the coupler feedback is selected, the PA power detector is disabled via a switch (not shown) or placed in a high impedance state so as to not affect the feedback RF signal. The FEM configuration is controlled using a dedicated serial interface such as any standard interface (e.g., serial peripheral interface (SPI), etc.) could be used to control it.

For the static output power feedback, the $V_{DET}$ output from the FEM is a single-ended signal, which carries a low frequency signal (i.e. bandwidth<2 MHz), and is proportional or monotonic to the PA power output. Depending on the actual implementation, the detector in the PA may be constructed as either linear or logarithmic. The $V_{DET}$ signal is fed using a multiplexer 236 to a high speed $\Sigma\Delta$ ADC. The output of the ADC is filtered using a rate change filter (RCF) 232 and fed back to the TX, where a closed loop is implemented (not shown) to ensure that the GGE TX always settles to a stable and accurate power control level (PCL).

The $V_{DET}$ pin is also used to bring the PA output back through a coupler to the TRX, wherein the coupler typically provides 40 dB of attenuation. The PA coupling signal is fed to an I/Q auxiliary low noise amplifier (LNA)/transconductance amplifier (TA) 246. This signal is demodulated via mixer 240 using the TX local oscillator (LO), low pass filtered using SCF 238 and then digitized using an I/Q high-speed $\Sigma\Delta$ ADC 234. Alternatively, the front-end blocks used for normal RX operation may be reused for the evaluation of the TX signal without requiring a dedicated RF input and front-end for this. The ADC digitized I/Q output is first filtered and downsampled, and then fed into a CORDIC 228 which converts the signal back to the polar domain. As this conversion is less demanding in its requirements compared to the CORDIC used in the transmit path, it may be more easily implemented in software, thus eliminating the need for additional hardware. The samples of the converted signal are compared against the corresponding nominal amplitude and phase to determine the amplitude-dependent distortion and accordingly update the digital predistortion mechanisms, including the predistortion LUT 226, to ensure good RF linearization characteristics across PVT and frequency.

The transceiver circuit 200 also comprises two current steering DACs 214, 216 that function to provide bias control of the PA initial stages (typically the first two for GGE mode) and final stages. In the efficiency enhancement scheme of the invention, while the serial interface (or another dedicated interface) allows the TRX to control the PA initialization, wake-up, sleep and standby modes, the current steering DACs allow precise control of power level as well as leakage minimization in the PA. This not only results in overall enhanced PAE of the entire system but also allows the TRX/DBB to control the biasing in the PA to avoid inadvertent saturation in the PA under low battery and extreme antenna loading conditions.

The low frequency switched mode regulator 192 that powers the TRX improves the overall power efficiency of the system by avoiding the excessive power loss caused by an external low drop-out (LDO) linear regulator.

Similarly, a high-frequency switched regulator 198 is provided for improving the efficiency of the FEM. In this case, a high frequency device avoids possible contamination of the amplitude modulation by the switching frequency of the switcher 192.

The operation of the linearization mechanism of the present invention is described in more detail hereinbelow.

Predistortion Calibration (Linearization) Mechanism

The digital predistortion performed by the invention can be implemented in several ways. In one embodiment, the TX predistortion is represented in a functional format, i.e. the distortion nonlinearity is estimated and its inverse is computed. This inverse is approximated using a functional approximation such as an efficient volterra series implementation, polynomial or exponential approximation, etc. or alternatively by interpolation between several known points using linear, second order or cubic spline interpolation etc.

Figure 10A:
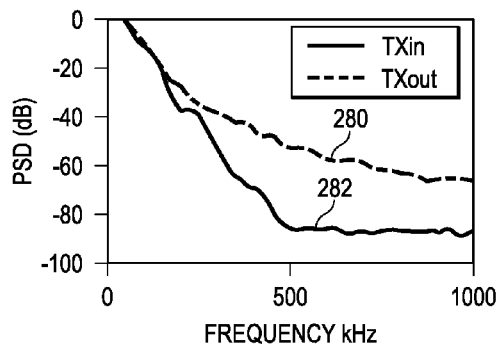
FIG. 10A is a graph illustrating the impact of uncompensated distortions on the close-in modulation spectrum of an EDGE transmitter.
Figure 10B:
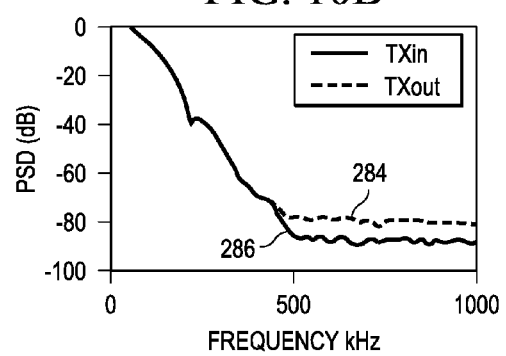
FIG. 10B is a graph illustrating the impact of using an LUT based predistortion scheme on the close-in modulation spectrum of an EDGE transmitter.
Figure 10C:
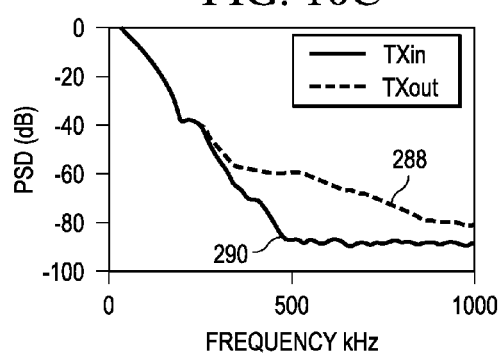
FIG. 10C is a graph illustrating the impact of using a polynomial predistortion scheme on the close-in modulation spectrum of an EDGE transmitter.
Figure 10D:
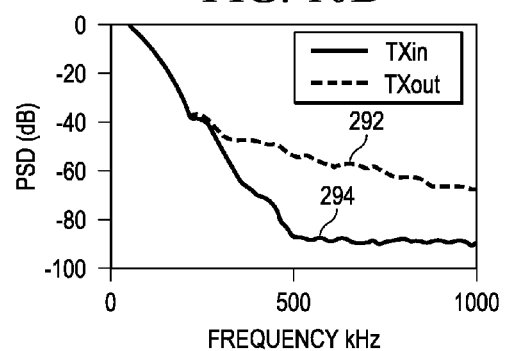
FIG. 10D is a graph illustrating the impact of using a closed loop proportional/integral (PI) compensation scheme on the close-in modulation spectrum of an EDGE transmitter.

Due the nature of the TX nonlinearity, the impact of PVT, frequency, VSWR and aging, however, use of any compact functional approximation is not sufficiently robust especially for cellular applications, where compactness and low power are of prime importance. FIGS. 10A, 10B, 10C and 10D provide a comparison of different predistortion realization schemes and the TX performance achievable under normal operation. Note that the input and output power levels are normalized in these figures. In particular, FIG. 10A illustrates the impact of using no predistortion scheme on the close-in modulation spectrum of an EDGE signal; FIG. 10B illustrates the impact of using an LUT predistortion scheme on the close in modulation spectrum of an EDGE signal; FIG. 10C illustrates the impact of using a polynomial predistortion scheme on the close in modulation spectrum of an EDGE signal; and FIG. 10D illustrates the impact of using closed loop proportional/integral (PI) compensation on the close-in modulation spectrum of an EDGE signal.

Table 1 presented below provides a quantitative comparison of the TX performance using these different predistortion representations. The schemes compared include no predistortion, LUT based predistortion, a $6^{th}$ order polynomial approximation of computed predistortion as well as the use of a Proportional Integral (PI) controller to close the predistortion loop in real time.

TABLE 1

Comparison of selected EDGE TX parameters as a function of predistortion representation

| Predistortion Representation | EVM (dB) | EVM (%) | ACPR @ 400 kHz (dBc/Hz) |
|---|---|---|---|
| Nearly Ideal TX | −60 | 0.1 | −72 |
| No predistortion | −20 | 10 | −46 |
| LUT predistortion | −58 | 0.13 | −70.1 |
| Polynomial predistortion | −42 | 0.8 | −58.1 |
| Proportional-Integral (PI) control | −32 | 2.5 | −48 |

Based on the results presented above, in Table 1, as well as the discussion presented supra, the use of a predistortion look-up table (LUT) is optimal for the feedforward calibrated predistortion.

Predistortion Calibration Methodology

The RF linearization compensation scheme of the present invention is operative to create controllable TX signal leakage (or RF coupling) from the TX to the RX and to use (if available) an existing on-chip receiver, which is normally inactive during the TX burst in the case of half-duplex operation. It is appreciated, however, that other configurations are contemplated by the invention, such as (1) the receiver may be located off-chip, (2) only a portion of the receiver required for demodulating the RF output signal may be present, (3) the transceiver operates full-duplex and thus a second receiver chain is required.

In the case of half-duplex operation with an on-chip receiver, the use of TX LO in the receiver while transmitting allows the on-chip RX chain to demodulate the RF output and use the digital I/Q RX outputs to perform calibration of the PA predistortion tables. The signal at the output of the PA is represented mathematically as:

$$Y_{PA}(t)=G_{PA}(\beta_{MN} \cdot G_{DPA}(A_{AM}(t))) \cdot \cos(\omega_c t+\theta_{PM}(t)+\phi_{DPA}(t)+\phi_{PA}(t)) \quad (1)$$

where $A_{AM}(t)$ is the amplitude modulation signal input to the DPA;

$\theta_{PM}(t)$ is the total phase modulation fed into the DPA;

$G_{DPA}(\bullet)$ is the AM/AM transfer characteristic of the DPA;

$\phi_{DPA}(t)$ is the AM/PM transfer characteristic of the DPA;

$\beta_{MN}$ is the time-invariant attenuation of the matching network at the output of the DPA;

$G_{PA}(\bullet)$ represents the AM/AM contribution by the PA;

$\phi_{PA}(t)$ represents the AM/PM contribution by the PA;

Using the TX LO for the mixer in the on-chip RX allows for the recovery of the following baseband I/Q signals:

$$V_I(T) \cong A_{LNA}(t) \cdot A_{TXLO}/2[\cos(\omega_c t_d+\theta_{PM}(t_d)) \cdot \cos(\phi_{DPA}(t)+\phi_{PA}(t))-\sin(\omega_c t_d+\theta_{PM}(t_d)) \cdot \sin(\phi_{DPA}(t)+\phi_{PA}(t))]$$

$$V_Q(T) \cong A_{LNA}(t) \cdot A_{TXLO}/2[\cos(\omega_c t_d+\theta_{PM}(t_d)) \cdot \sin(\phi_{DPA}(t)+\phi_{PA}(t))+\sin(\omega_c t_d+\theta_{PA}(t_d)) \cdot \cos(\phi_{DPA}(t)+\phi_{PA}(t))] \quad (2)$$

where $t_d$ is the additional time delay in the coupled RF signal;

$A_{LNA}(t)$ is defined as $A_{LNA}(t)=G_{LNA}\cdot\alpha_{RF}\cdot G_{PA}(\beta_{MN}\cdot G_{DPA}(A_{AM}(t)))$;

$\alpha_{RF}$ is the coupler attenuation;

$G_{LNA}$ is the gain of the RX LNTA;

$A_{TXLO}$ is the strength of the TX-LO signal;

In the expressions in Equation 2 above, the first term on the right hand side is the desired component while the second term is the undesired component. For reasonable estimation of the predistortion, the contributions from this second term should be at least 10 dB smaller than the desired term. In addition, for $\theta_{PM}(t_d) \ll \omega_c t_d$, the impact of the presence of modulation in the signal and TX-LO is not a major impediment, i.e.

$$A_{LNA}(t)\cdot A_{TXLO}/2 = \frac{1}{2}\cdot A_{TXLO}\cdot G_{LNA}\cdot\alpha_{RF}\cdot G_{PA}(\beta_{PAD}\cdot G_{PPA}(A_{AM}(t))) = G_{P\_loop}\cdot G_{PA}(\beta_{PAD}\cdot G_{PPA}(A_{AM}(t))) \quad (3)$$

where $G_{P\_loop} = \frac{1}{2}\cdot A_{TXLO}\cdot G_{LNA}\cdot\alpha_{RF}$ is a constant term referred to as predistortion loop gain;

$G_{PA}(\beta\cdot G_{PPA}(A_{AM}(t)))$ is the cumulative AM/AM distortion in the PPA and PA;

In the case where the TX LO is perfectly time aligned to the TX leakage signal being down converted, i.e. $t_d=0$, the recovered RX Q signals are as follows:

$$V_I(T) \approx G_{P\_loop}\cdot G_{PA}(\beta_{MN}\cdot G_{DPA}(A_{AM}(t)))\cdot[\cos(\phi_{DPA}(t)+\phi_{PA}(t))]$$

$$V_Q(T) \approx G_{P\_loop}\cdot G_{PA}(\beta_{MN}\cdot G_{DPA}(A_{AM}(t)))\cdot[\sin(\phi_{DPA}(t)+\phi_{PA}(t))] \quad (4)$$

In Equation 4, both demodulated I and Q samples contain information about the amplitude and phase of the received TX signal, which can be recovered by simple mathematical manipulations. Squaring and adding the terms in Equation 4 yields:

$$V_I^2(T)+V_Q^2(T) = \sqrt{2} G_{P\_loop}\cdot G_{PA}(\beta_{MN}\cdot G_{DPA}(A_{AM}(t))) \quad (5)$$

Rearranging terms, the amplitude distortion introduced by the system is recovered as follows:

$$G_{PA}(\beta_{MN}\cdot G_{DPA}(A_{AM}(t))) = \frac{V_I^2(T) + V_Q^2(T)}{\sqrt{2} \, G_{P\_loop}} \quad (6)$$

where $A_{AM}(t)$ is the signal amplitude profile, which is known to the TRX;

the TRX and PA AM/AM distortion is given by AM/AM=$G_{PA}(\beta_{MN}\cdot G_{DPA}(\bullet))$;

Correspondingly, the AM/PM in the system can be recovered by rearranging and taking a ratio of the terms in Equation 4 as follows:

$$\phi_{DPA}(t) + \varphi_{PA}(t) = \arctan\left(\frac{V_Q(T)}{V_I(T)}\right) \quad (7)$$

wherein the left-hand side in the above relation comprises the phase profile introduced by the combination of both the DPA and PA. This phase profile with respect to the amplitude profile $A_{AM}(t)$ constitutes the AM/PM introduced by the TX front end.

Structure of an EDGE Burst

Figure 12:
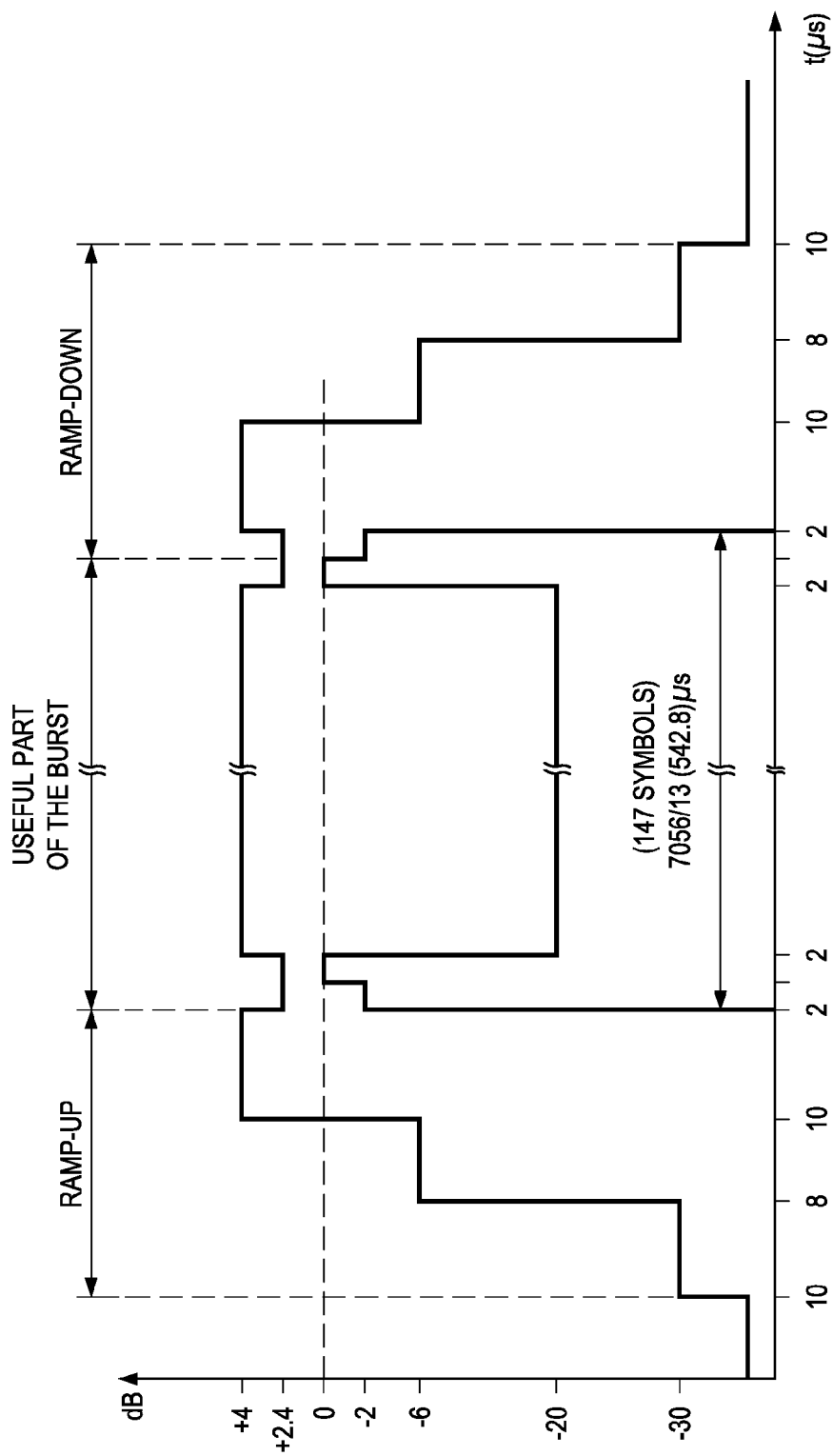
FIG. 12 is a diagram illustrating the structure of a basic EDGE burst.
Figure 13:
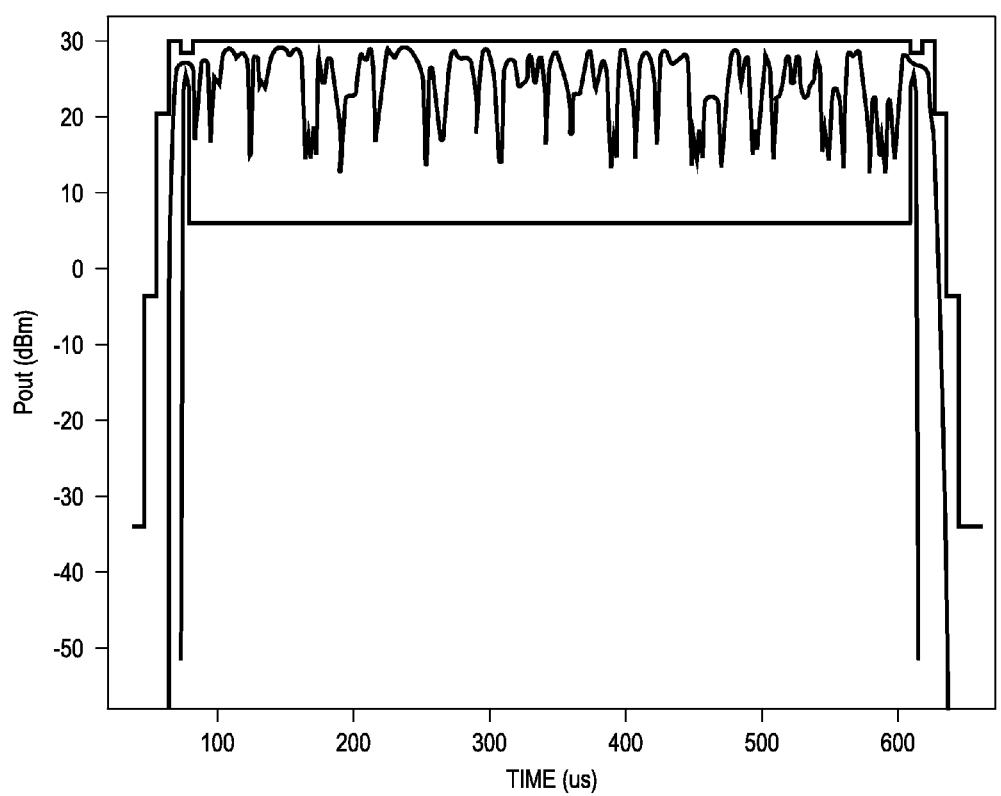
FIG. 13 is a diagram illustrating the structure of an actual example EDGE burst with EDGE modulation and up/down power ramps.

To aid in illustrating the principles of the invention, FIGS. 12 and 13 show the structure of a basic EDGE burst. FIG. 12 illustrates the structure of a basic EDGE burst while FIG. 13 illustrates the structure of an actual example EDGE burst with EDGE modulation and up/down power ramps. As indicated in the Figures, in EDGE transmission, before the start of a burst, the PA output is very low and the signal is at a pedestal value below −50 dBm. During the burst, the PA is ramped up, using an appropriate ramp profile, to the average power of the burst plus 1.2 dB (25.808 dBm in FIG. 13). After ramp-up, the transmission enters the useful part of the burst where the actual EDGE signal transmission takes place. This lasts for 542.8 μs or 147 EDGE symbols. At the end of the burst, using the tail bits the modulation is merged to the ramp down. In this ramp down period, the signal transmitted by the PA follows a specific spectrally-tame profile back to the pedestal level. The ramp profile in EDGE is typically raised-cosine (RC) or root-raised cosine (RRC).

Predistortion Calibration

Figure 14:
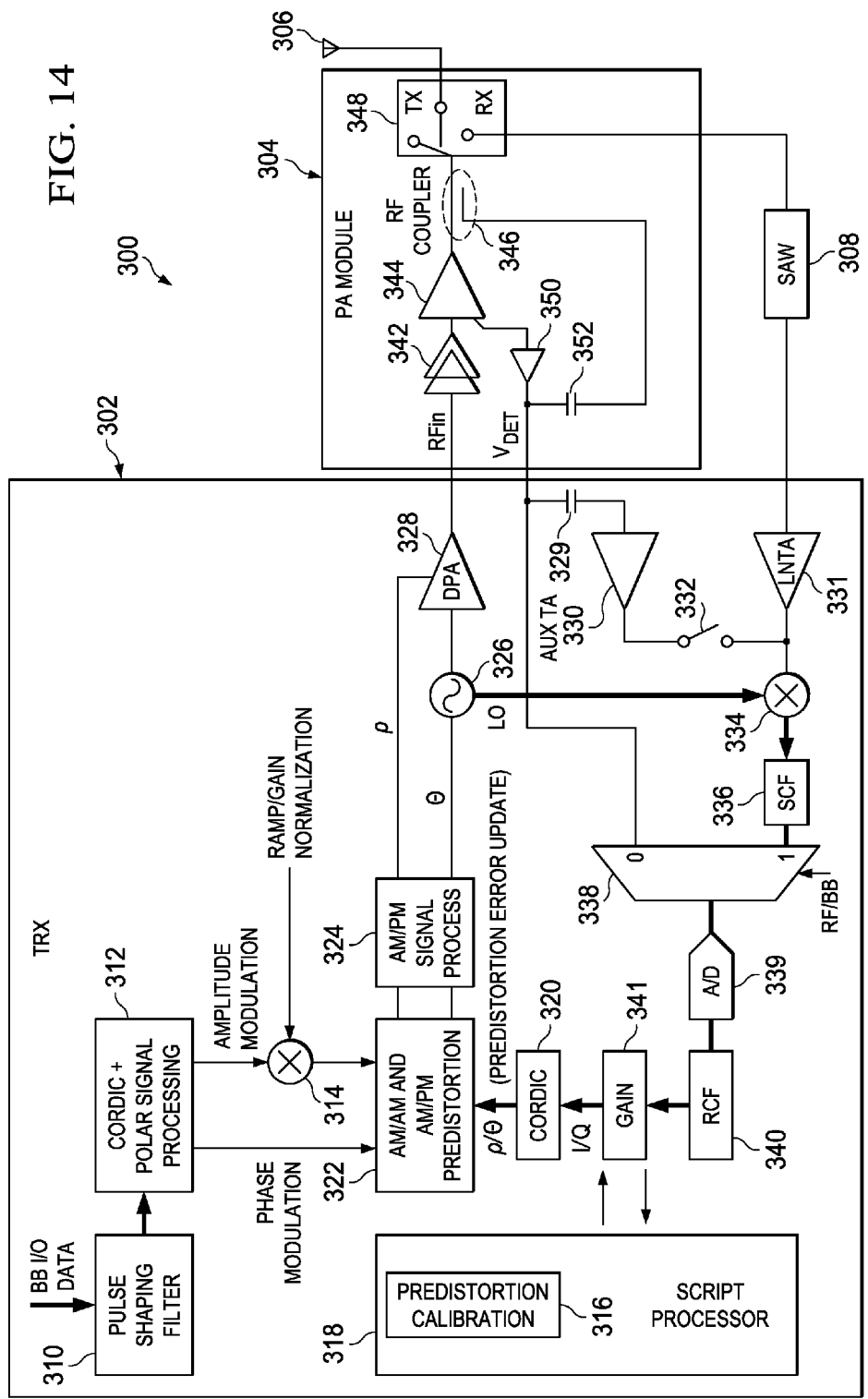
FIG. 14 is a diagram illustrating the second embodiment of the linearization mechanism of the present invention implemented in a DRP based GSM/EDGE polar transmitter.

A diagram illustrating the second embodiment of the linearization mechanism of the present invention implemented in a DRP based GSM/EDGE polar transmitter is shown in FIG. 14. The polar transmitter, generally referenced 300, comprises a transceiver circuit 302, PA module 304, SAW filter 308 and antenna 306. The transceiver comprises a script processor 318 (or other controller/processor device) incorporating program code means 316 for implementing the predistortion calibration mechanism of the present invention, pulse shaping filter 310, CORDIC and polar signal processing 312, ramp/gain normalizer 314, AM/AM and AM/PM predistortion LUT 322, AM/PM signal processing 324, local oscillator (LO) 326, DPA 328, coupling capacitor 329, auxiliary low noise amplifier (LNA)/transconductance amplifier (TA) 330, low noise transconductance amplifier (LNTA) 331, switch 332, mixer 334, filters 336, 340, multiplexer 338, ADC 339, gain block 341 and feedback CORDIC 320. The FEM comprises amplifiers 342, 344, signal coupler 346, buffer 350, capacitor 352 and RF switch 348.

The predistortion calibration is performed once after the TRX and the FEM ICs or modules have been assembled onto to the cell phone PCB. For calibration purposes, a dedicated ramp is used to scan all the digital DPA code levels. For each code, the PA output is demodulated to determine the I/Q signal samples mathematically using the equations presented supra. The AM/AM and AM/PM predistortion values are computed from the recovered I and Q samples and loaded into the digital predistortion LUT referenced 226 in FIG. 9 and referenced 322 in FIG. 14.

For the calibration to be precise, the measurements are performed by applying a staircase ramp, whose steps can be spaced either linearly or exponentially depending on the actual type of the PA being used. At each stage, the output is allowed to settle after which a static measurement with good accuracy is then stored. An example calibration sequence that utilizes the structure shown in FIG. 14 is presented below. Note that the method presented below can be implemented and stored as software/firmware 316 in a form able to be executed by the script processor 318 or other computing resource.

Figure 15:
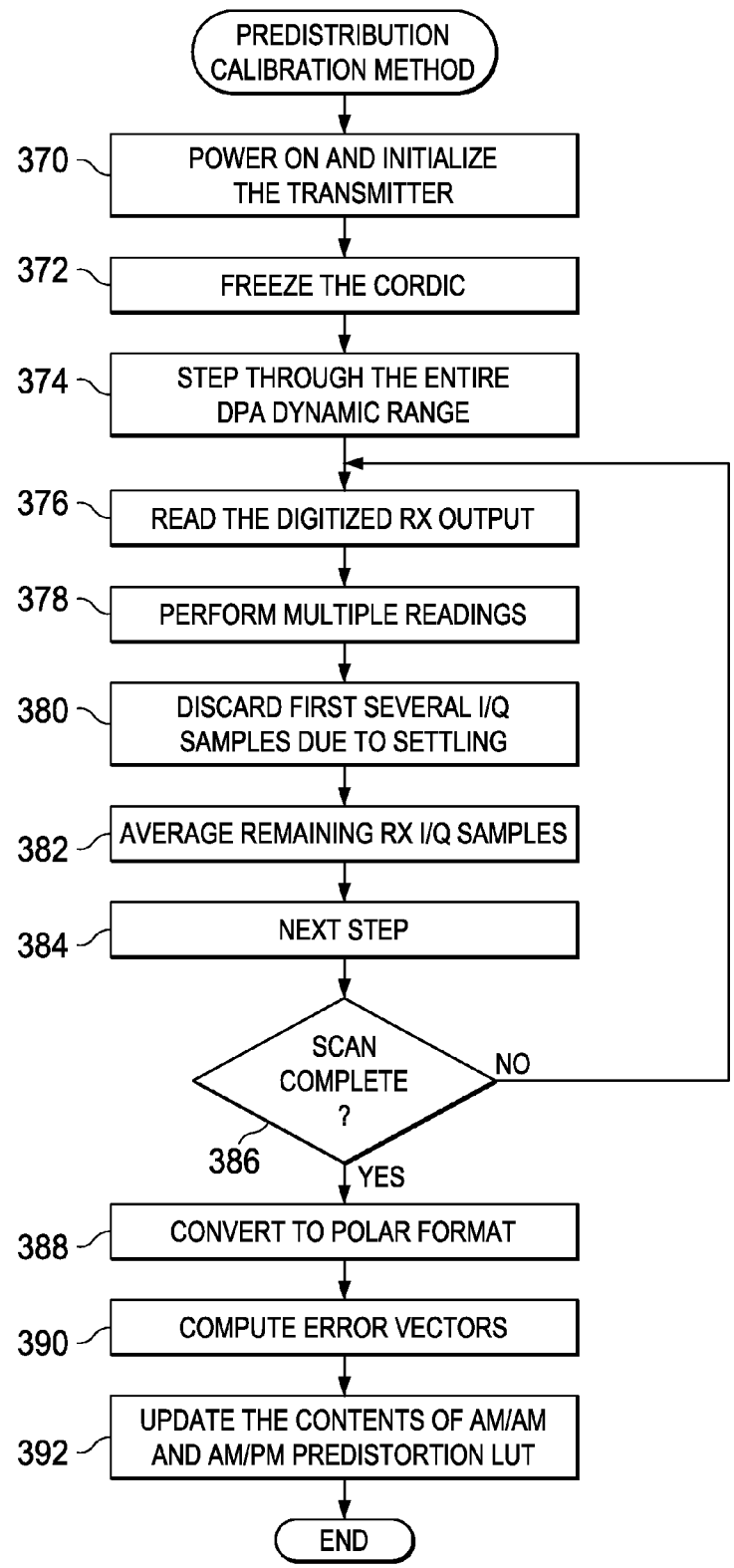
FIG. 15 is a flow diagram illustrating the predistortion calibration method of the present invention.
Figure 16:
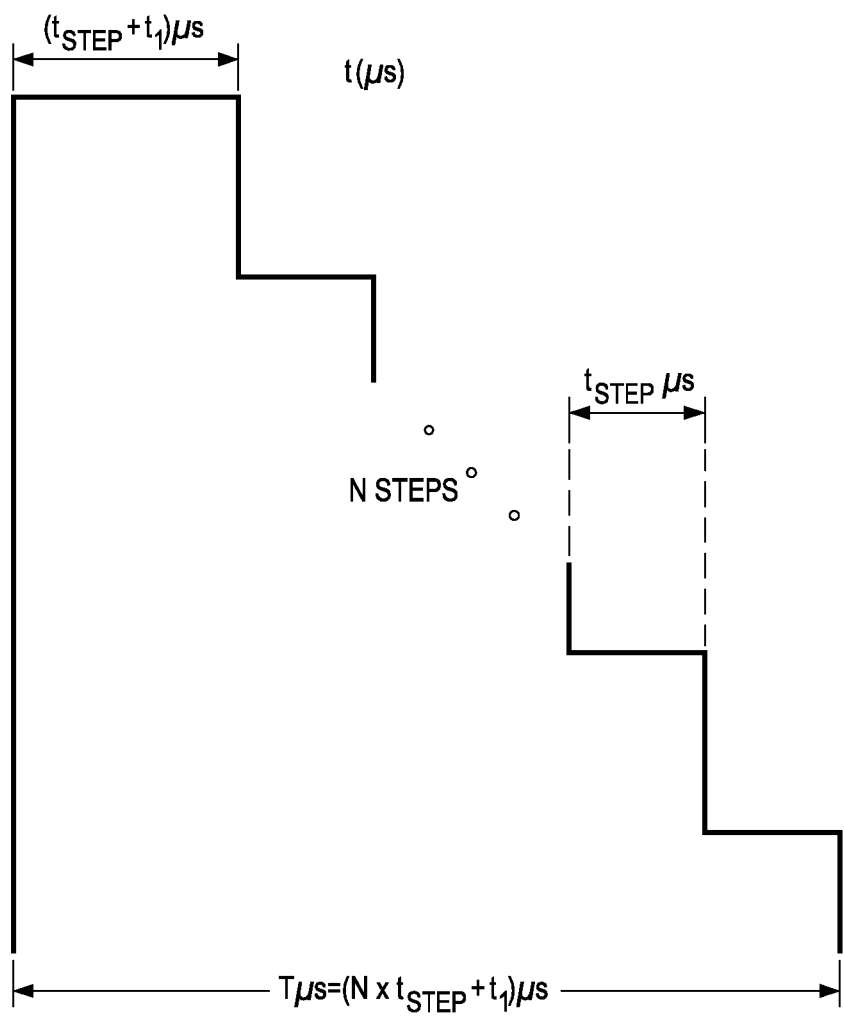
FIG. 16 is a diagram illustrating an example predistortion self-calibrating training sequence.

A flow diagram illustrating the predistortion calibration method of the present invention is shown in FIG. 15. With reference to FIGS. 14 and 15, the transmitter (TX) is first powered on and initial calibration compensations are performed in order to prepare the TX for modulation (step 370). The CORDIC phase and amplitude are frozen, whereby the frozen PM value is DTX_CORDIC_THETA and the frozen AM value is DTX_CORDIC_RHO (step 372). The entire DPA dynamic range (or a portion thereof) is covered in N digital amplitude modulation steps (step 374). A diagram illustrating an example predistortion self-calibrating training sequence is shown in FIG. 16.

Since the CORDIC is frozen, these steps can be applied using script processor write operations at the Ramp/Gain Normalization Port. Note that the DPA dynamic range can be covered in either equal spaced or exponentially spaced (preferred) intervals depending on the linearization requirements at different power levels. Using too few points at lower power levels may render the predistortion quantization level too coarse at lower power levels.

The phase input to the predistortion is constant as the CORDIC is frozen. The constant phase value from the CORDIC and the value applied at the ramp multiplied with DTX_CORDIC_RHO as DTX_PRED_THETA and DTX_PRED_RHO are stored. Note that $t_{step}$ is the time spent at each training sequence point. For the initial step, an additional $t_1$ ms time is added to account for the extra settling time needed for the large min-max step.

The data is passed through the TX and then coupled in a controlled manner into the RX. The digitized RX output is then read as DRX_PRED_I and DRX_PRED_Q (step 376). This reading is done at an appropriate clock rate, which may be lower than the Nyquist rate, as the predistortion update may be based on samples collected over multiple consecutive bursts (i.e., it is not necessary to densely sample a single ramp profile). For each DTX_PRED_THETA and DTX_PRED_RHO setting, multiple readings may be taken for each step after allowing for the RX settling time (step 378). Reading of the DRX values is triggered by the step change in DTX_PRED_RHO. The first few I/Q samples read from the RX are discarded (if needed) due to settling ambiguity. (step 380). The remaining RX I/Q values are averaged (step 382). The last value is possibly discarded due to possible overlap with the next step. The next step is determined (step 384) and if additional steps remain (step 386), the method repeats steps 376 through 384 until all N steps are sampled (i.e. the scan is complete).

Reading RX output after the scan is complete yields N DRX_PRED_I/Q averaged pairs (from DRX), corresponding N DTX_PRED_RHO values (i.e. number of points in the training sequence applied) and the frozen phase value DTX_PRED_THETA. DRX_PRED_I/Q is converted to polar format using the CORDIC formulas (step 388). Note that this CORDIC can be realized in either hardware or in the script processor using the TX firmware using:

DRX_PRED_RHO=sqrt(DRX_PRED_$I$^2+DRX_PRED_$Q$^2)

DRX_PRED_RHO=atan(DRX_PRED_$Q$,DRX_PRED_$I$)

The N valued error vectors are then computed (step 390) as follows:

PRED_ERR_RHO=DTX_PRED_RHO−ALPHA*DRX_PRED_RHO

PRED_ERR_THETA=DTX_PRED_THETA−BETA*DRX_PRED_THETA where ALPHA and BETA are scaling coefficients.

Using the above computed predistortion error, the AM/AM and AM/PM predistortions are updated (step 392). For the AM/AM predistortion, the input to the LUT is the uncorrected ramp, i.e. N point DTX_PRED_RHO, while the output is the adjusted digital amplitude word DTX_PRED_RHO+PRED_ERR_RHO. For the AM/PM predistortion, the input to the LUT is the N point DTX_PRED_RHO applied, while the output is the PRED_ERR_THETA measured as a result of the above measurements.

To further enhance calibration accuracy of the contents of the AM/AM and AM/PM predistortion LUTs, the invention provides two possible options.

In the first option, the predistortion calibration sequence is repeated M times. The predistortion LUT is loaded with the average of the error measurements, as follows:

PRED_ERR_RHO_AVE=SUM(PRED_ERR_RHO (1:$M$))/$M$

PRED_ERR_THETA_AVE=SUM(PRED_ERR_THETA(1:$M$))/$M$

Although this scheme adds additional calibration time, it results in much improved calibration accuracy due to the reduced impact of measurement noise by $\sqrt{M}$. Note that M is preferably chosen to optimize the predistortion calibration accuracy versus calibration time. This scheme assumes good repeatability of measurements, which is typically the case for a cellular system as the RF PA is memoryless.

In a second option, rather than repeat the same calibration sequence multiple times, more time may be spent at each calibration ramp level. Measurement noise is also reduced by increasing $t_{step}$ and averaging over multiple DRX readings. This scheme reduces the measurement noise due to more temporal averaging at each step, but does not account for any repeatability issues in the measurements.

Predistortion Compensation

The predistortion calibration performed at the time of manufacture is carried out at a single set of operating conditions. The factory predistortion calibration does account for any process variations in the devices since it is carried out for each TRX and FEM on the cell phone printed circuit board (PCB). The AM/AM and AM/PM predistortions in the DPA and the PA, however, are also a function of temperature, frequency of operation, battery voltage and VSWR, which are typically constantly changing in the field. Antenna load variations causing varying VSWR are hard to resolve unless an RF coupler is explicitly placed next to the antenna. Due to the very low cost integrated solution targeted by the DRP technology, however, the impact of VSWR variations is ignored. In accordance with the invention, the impact of the other three major parameters identified above is dealt with using the compensation schemes outlined below. The framework for the predistortion compensation is the same as for the transmitter shown FIG. 14.

Open Loop Predistortion Compensation

The linearization mechanism also provides for the calibrated predistortion LUT to be adjusted based on the feedback of the many on-chip sensors integrated into a DRP based polar TX. This includes, but is not limited to, the feedback from the on-chip temperature sensor, knowledge of the TX frequency of operation by the firmware executing on the script processor and any other mechanisms that are available in the PA/FEM about the changing antenna load conditions and/or the battery voltage, etc.

For any of these feedbacks, the adjustment in the calibrated predistortion LUT can be done by doing simple arithmetic, fully linear, piece-wise linear or any other functional computations that are performed using the on-chip script processor. The calibrated predistortion values for such an update are read from the calibrated LUT, modified by the script processor, and the updated results used to overwrite the LUT values (assuming only one LUT is used for both calibration and compensation).

Alternately, in case the LUT is programmed as separate memory banks for both calibration and compensation, the compensation correction may be stored in the compensation bank without actually modifying the calibrated predistortion value. This approach is more time efficient from the script processor operational time perspective, but increases the overall memory size by two time.

Quasi-Closed Loop Predistortion Compensation

Fully closed loop operation that would effectively remove AM/AM and AM/PM distortions would be very demanding in terms of implementation complexity, as the dynamics of the compensation loop would be dictated by inevitable delays in the signal processing paths. Instead, the quasi-closed loop mechanism of the invention is operative to update the predistortion tables in a time sliced manner, such that the predistortion operates in feed-forward open-loop while being updated at a sufficiently high rate to accommodate for variations in the distortions over time. To avoid the requirement of a dedicated time for the predistortion compensation, the mechanism outlined above for calibration is performed during the PA ramp time. Use of the PA ramp is highly suitable for such a measurement because the GGE transmitter is typically not dynamically modulating the phase during both ramp up and down phases, only the amplitude is varied following a ramp profile. The RX chain is turned on during these times to make the appropriate measurements and recover the I and Q samples.

While the digitally controlled PA (DPA) code is either increasing or decreasing, the amplitude and phase of the I/Q samples recovered by the on-chip RX are used to determine the instantaneous correction to the calibrated AM/AM and AM/PM pre-distortion values loaded in the predistortion table at that particular time.

Figure 17:
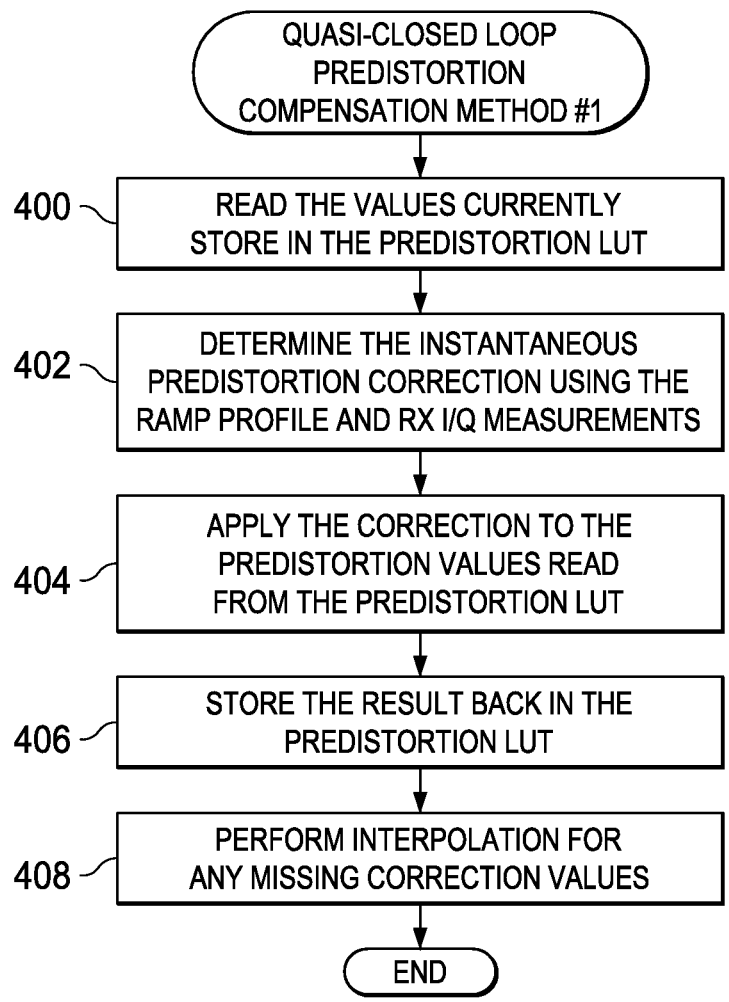
FIG. 17 is a flow diagram illustrating a first quasi-closed loop predistortion calibration method of the present invention.

For the N valued AM/AM and AM/PM LUT(s), the predistortion compensation updates the predistortion LUT as described below. A flow diagram illustrating a first quasi-closed loop predistortion calibration method of the present invention is shown in FIG. 17. First, the current values stored in the predistortion LUT are read (step 400). The instantaneous predistortion correction value is then determined by the scripts processor or other computing resource using the power ramp profile and the RX measurements (step 402). The correction values calculated are applied to the predistortion values read from LUT using the script processor (step 404). The results are stored back in the predistortion LUT (step 406) and interpolation is performed to determine any missing predistortion LUT correction values (step 408).

Figure 18:
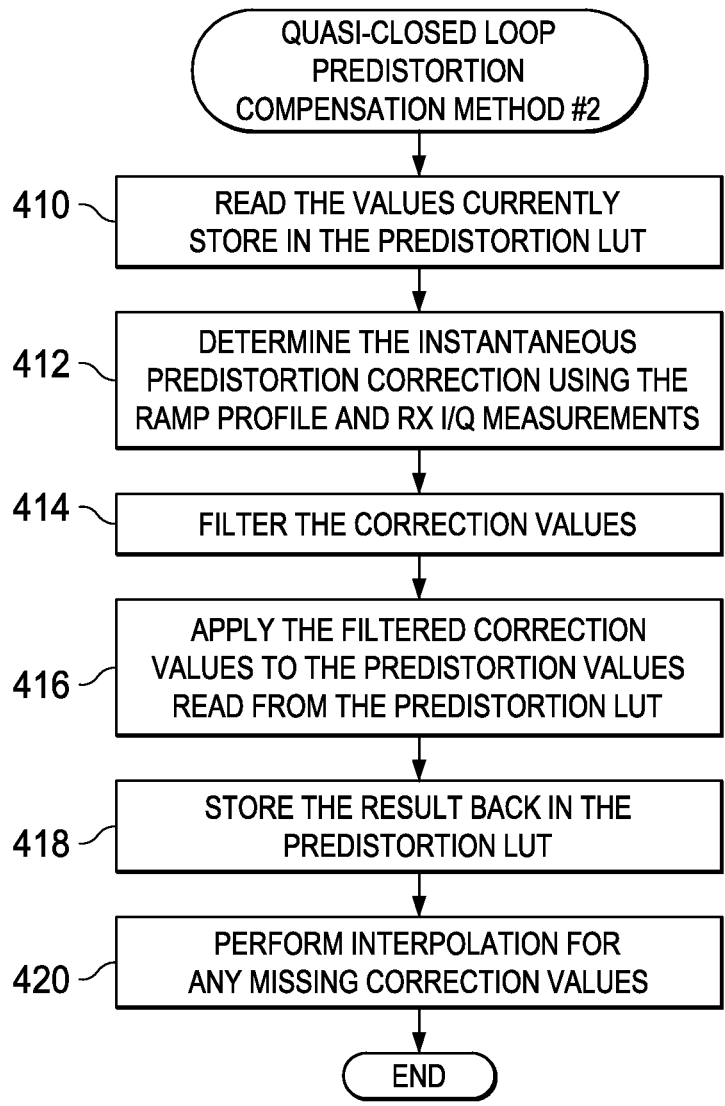
FIG. 18 is a flow diagram illustrating a second quasi-closed loop predistortion calibration method of the present invention.

Alternately, instead of modifying the initial predistortion entries every time, the new LUT values are used to update the previous values by first applying a filter function. The filter function can be any suitable function such as applying a certain weight or averaging the new with the previous values. A flow diagram illustrating a second quasi-closed loop predistortion calibration method of the present invention is shown in FIG. 18.

First, the current values stored in the predistortion LUT are read (step 410). The instantaneous predistortion correction is then determined by the script-processor or other computing resource using the power ramp profile and the RX measurements (step 412). The correction values are then filtered using any suitable filter function (step 414). Examples of filter functions include, but are not limited to, (1) a moving average filter, (2) infinite impulse response filter (IIR) or (3) an autoregressive moving average (ARMA) filter. The filtered correction values are then applied to the predistortion values read from LUT using the script processor (step 416). The results are stored back in the predistortion LUT (step 418) and interpolation is performed to determine any missing predistortion LUT correction values (step 420).

Power Control Level Compensation

All GGE transmitters need to comply with stringent output power level regulation requirements. The power control level (PCL) accuracy required as per GGE specifications is ±2 dB. The targeted PCL accuracy is, however, typically much tighter (i.e., typically <±1 dB), in order to enhance the efficiency of the overall TX system, minimize the production of additional distortions and maximize the battery life. This accurate power control is achieved using the power detect feedback from the PA in the FEM.

In accordance with wireless standards, the PCL accuracy must be met in every single GGE burst. Therefore, the PCL compensation is activated during the ramp-up phase of each GGE burst. Since the script processor is also used for PCL compensation, the quasi-closed loop predistortion compensation is performed during the ramp-down phase, without engaging the PCL loop in particular. The mechanism provides for sharing the RF coupling signal with the PA power detect into the same pin and then separates them via blocking capacitors or via the switch fabric in both the FEM and the TRX. The operation of PCL compensation is summarized hereinbelow.

For PCL, the single-ended $V_{DET}$ from the FEM bypasses the LNA and the mixer stages and injects the PA power detect signal directly into the RX ADC. The RX high speed EA ADC output is passed through a filtering and decimation stage. This feedback is appropriately scaled and compared to the actual ramp profile command. The difference is computed in the script processor and this error signal is used to adjust the input ramp digital command word, using an integral or other control scheme such that the PCL error applied to the DPA is zeroed. This scheme is performed iteratively and is able to achieve the requisite PCL accuracy.

Hybrid Linearization Compensation Scheme

The mechanism also provides for a means to combine/interleave the above described compensation mechanisms to take advantage of several intelligent data fusions. For example, the feedback from on-chip resources are used to augment the operation of the quasi-closed loop compensation scheme. The RF feedback in the FEM may not be able to discriminate the impact of the battery voltage drop in the cell phone, but if such a feedback is available from the power management (PM) system or the baseband quality monitor, the loop may be able to adjust the bias control knobs in the FEM to ensure stability and avoid possible saturation, while also adjusting the predistortion LUT in a known pre-characterized fashion.

The power control level compensation and the predistortion compensation schemes can also be interleaved in the normal operation of the TRX. While the PCL compensation loop operates during the ramp-up time, the predistortion compensation loop may be enabled during the ramp-down mode. This brings the information feedback of the absolute power level in the former case and the relative power levels in the latter case. These two mechanisms combined allow the TRX to track the changes in the power control LUT over the operational span of the cell phone. The power control LUT essentially defines the transformation between the required average power at the output of the transmitter to the average DPA code.

Advantages of the Linearization Mechanism

The linearization mechanism operates in a pseudo-closed loop manner. This is highly advantageous because of the following reasons: First, the linearization mechanism is not restricted to the limitations of a purely characterization based open loop predistortion scheme, wherein the tolerance of the predistortion scheme to the variations in the nonlinear characteristics due to process variation and aging is minimal. Second, the linearization mechanism does not consume excessive power and involve high realization complexity as does a completely closed loop scheme. The quasi-closed loop operation is activated only temporally during the ramp-up/down times in EDGE transmission which comprise only 5% of an EDGE burst. In addition, the closed loop operation is self-corrective for the predistortion tables which makes the system immune to the temporal and ambient changes in the RF transceiver and the PA non-linearity variations caused by changes in temperature, frequency of operation and VSWR induced by antenna load variations.

Furthermore, both linear filtering and non-linear threshold based mechanisms may be built into the quasi-closed loop system allowing it to ignore predistortion errors in excess of a predefined limit, which may suggest irrelevant RF interference from another source that is to be ignored. Contrarily, the fully closed-loop alternative, which relies on the continuous monitoring of the TX signal, can be easily mislead by a strong incoming signal that is independent of the TX signal of interest.

Closing the predistortion compensation loop and the computation of the update to the contents of the predistortion LUT in real-time during the ramp-up/down of the PA power ramp permits tracking the predistortion changes as they occur due to the changes in TX operational parameters. The updated tables can be used during the entire subsequent burst ensuring good TX modulation quality under all operating conditions.

As described supra, rather then update the predistortion look-up tables in real-time, the correction to the predistortion look-up tables can be computed over several bursts using a moving average window, i.e. the subsequent bursts are used to update the previously filled entries with a time constant comparable to the thermal constant.

The update of the predistortion LUT need not be carried out in real-time, rather the feedback data can be processed using the on-chip script processor or other analogous computing resource. The results are stored in memory and the predistortion LUT is updated during an idle or RX burst, while the script processor is not involved in time-critical sequencing or control operations.

The digital predistortion update calculation is performed on a well-behaved unmodulated signal during a PA power ramp. In this scheme, the phase modulation is constant and the amplitude changes monotonically. Thus, unlike continuous closed loop operation, there is little sensitivity in the linearization mechanism to any external interferer.

A further benefit is that the mechanism requires minimal external hardware support. Since the mechanism utilizes existing on-chip RX resources in a TDD fashion, no special analog hardware is required. Moreover, the cellular handset output power is relatively low (~2 W), which results in an RF nonlinearity which is memoryless in nature. At any given instant of time this nonlinearity can be adequately represented as a static mapping, which permits a smaller sized predistortion LUT. The digital update calculations are performed mainly using the script processor with very little extra dedicated digital hardware, causing the overall digital hardware implementation to be very compact.

In addition, the mechanism does not require a dedicated compensation time. The mechanism calculates the compensation to the digital predistortion LUT contents during the regular PA ramp time. The table is either updated during the ramp or the correction is applied during a time slot when the TX is inactive and the script processor is available.

Note that in an alternative embodiment, for better accuracy, several subsequent bursts are used to update the predistortion LUTs with a programmable time constant. This time constant is realized either using a moving average or a leaky time-integration filter. These operations, however, are all carried out in the background and do not consume any dedicated processor time.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A method of linearization of a transmit amplifier, said method comprising the steps of:
    scanning a plurality of power amplifier codes;
    generating a transmit amplifier output signal in accordance with each code scanned; and
    determining one or more predistortion values in accordance with said transmit amplifier output signal, wherein said transmit amplifier comprises a digitally controlled power amplifier.

2. A method of compensating for predistortion of a power amplifier, said method comprising the steps of:
    scanning a plurality of power amplifier codes by applying a ramp up or ramp down signal to a transmitter circuit;
    generating a power amplifier output signal in accordance with each code scanned;
    providing controlled leakage of said power amplifier output signal to a receiver chain operative to demodulate said power amplifier output signal to yield a demodulated signal therefrom;
    calculating amplitude and phase distortion values in accordance with said demodulated signal; and
    calibrating a predistortion table with said amplitude and phase distortion values.

3. The method according to claim 2, wherein said receiver chain is co-located on-chip with a transmitter operative to generate said power amplifier output signal.

4. The method according to claim 2, wherein said step of calibrating comprises the step of storing said amplitude and phase distortion values in a predistortion look up table (LUT).

5. The method according to claim 2, wherein said step of generating a transmit amplifier output signal is performed during a power ramp up or ramp down of a GGE burst.

6. The method according to claim 2, wherein said step of generating a power amplifier output signal is performed during the payload of a burst having a known waveform of varying amplitude.

7. The method according to claim 2, wherein said power amplifier comprises a combination of digitally controlled pre-power amplifier and radio frequency (RF) power amplifier.

8. A method of predistortion calibration of a power amplifier, said method comprising the steps of:
stepping through a dynamic range of codes of said power amplifier during the ramp up portion of a GSM/GPRS/EDGE (GGE) burst transmission;
inputting each code to a transmit chain comprising a predistortion look up table (LUT) of transmit amplifier predistortion values to generate a radio frequency (RF) output signal in response thereto;
demodulating said RF output signal to yield a demodulated signal;
calculating an instantaneous correction to the predistortion values stored in said predistortion LUT in accordance with said demodulated signal; and
updating the contents of said predistortion LUT in accordance with said calculated instantaneous correction.

9. The method according to claim 8, wherein said step of stepping is performed during the ramp down portion of a GSM/GPRS/EDGE (GGE) burst transmission.

10. The method according to claim 8, wherein said step of demodulating is performed utilizing a receiver chain co-located on-chip with said transmit chain.

11. The method according to claim 8, wherein said predistortion values comprise AM/AM and AM/PM predistortion values.

12. The method according to claim 8, wherein said step of updating comprises the steps of:
reading the predistortion values currently stored in said predistortion LUT;
applying said instantaneous correction to the predistortion values read from said predistortion LUT to yield corrected predistortion values thereby; and
saving said corrected predistortion values back into said predistortion LUT.

13. A method of predistortion calibration of a power amplifier, said method comprising the steps of:
stepping through a dynamic range of codes of said power amplifier;
inputting each code to a transmit chain comprising a predistortion look up table (LUT) of transmit amplifier predistortion values to generate a radio frequency (RF) output signal in response thereto;
demodulating said RF output signal to yield a demodulated signal;
calculating an instantaneous correction to the predistortion values stored in said predistortion LUT in accordance with said demodulated signal;
reading the predistortion values currently stored in said predistortion LUT;
applying said instantaneous correction to the predistortion values read from said predistortion LUT to yield corrected predistortion values thereby;
saving said corrected predistortion values back into said predistortion LUT; and
interpolating the updated contents of said predistortion LUT for any missing correction values.

14. A method of predistortion calibration of a power amplifier, said method comprising the steps of:
stepping through a dynamic range of codes of said power amplifier;
inputting each code to a transmit chain comprising a predistortion look up table (LUT) of transmit amplifier predistortion values to generate a radio frequency (RF) output signal in response thereto;
demodulating said RF output signal to yield a demodulated signal;
calculating an instantaneous correction to the predistortion values stored in said predistortion LUT in accordance with said demodulated signal;
updating the contents of said predistortion LUT in accordance with said calculated instantaneous correction;
reading the predistortion values currently stored in said predistortion LUT;
applying said instantaneous correction to the predistortion values read from said predistortion LUT to yield filtered corrected predistortion values; and
saving said corrected predistortion values back into said predistortion LUT.

15. The method according to claim 14, wherein said filtered corrected predistortion values are generated by applying a moving average filter to a plurality of instantaneous correction values.

16. The method according to claim 14, wherein said filtered corrected predistortion values are generated by applying an infinite impulse response (IIR) filter to a plurality of instantaneous correction values.

17. The method according to claim 14, wherein said filtered corrected predistortion values are generated by applying an auto-regressive moving average (ARMA) filter to a plurality of instantaneous correction values.

18. The method according to claim 14, wherein said filtered corrected predistortion values are generated by applying a nonlinear threshold function permitting said step of correcting to ignore inputs exceeding a predetermined range of expected values caused by strong interference induced into the receiver.

19. The method according to claim 8, wherein said power amplifier comprises a combination of digitally controlled pre-power amplifier and radio frequency (RF) power amplifier.

20. An apparatus for calibrating predistortion of a digitally controlled power amplifier (DPA), comprising:
circuitry for stepping through a range of codes of said DPA;
a transmit chain comprising a predistortion look up table (LUT) adapted to store a plurality of amplifier predistortion values, said transmit chain operative to generate a radio frequency (RF) output signal in response to each code;
circuitry for coupling said RF output signal to a receiver chain, said receive chain operative to demodulate said RF output signal to generate a demodulated signal therefrom;
circuitry for calculating corrections to the predistortion values stored in said predistortion LUT in accordance with values in the demodulated signal; and
update circuitry for updating the contents of said predistortion LUT in accordance with said calculated corrections.

21. The apparatus according to claim 20, wherein said circuitry for calculating comprises circuitry for incorporating information from one or more on-chip sensors in the calculation of said predistortion values.

22. The apparatus according to claim 21, wherein said on-chip sensor comprises a temperature sensor operative to generate temperature information.

23. The apparatus according to claim 20, wherein said circuitry for stepping comprises means for generating said range of codes during the ramp up portion of a GSM/GPRS/EDGE (GGE) burst transmission.

24. The apparatus according to claim 20, wherein said circuitry for stepping comprises circuitry for generating said range of codes during the ramp down portion of a GSM/GPRS/EDGE (GGE) burst transmission.

25. The apparatus according to claim 20, wherein said receive chain is co-located on-chip with said transmit chain.

26. The apparatus according to claim 20, wherein said predistortion values comprise AM/AM and AM/PM predistortion values.

27. An apparatus for calibrating predistortion of a digitally controlled power amplifier (DPA), comprising:

circuitry for stepping through a range of codes of said DPA;
   a transmit chain comprising a predistortion look up table (LUT) adapted to store a plurality of amplifier predistortion values, said transmit chain operative to generate a radio frequency (RF) output signal in response to each code;
   circuitry for coupling said RF output signal to a receiver chain, said receive chain operative to demodulate said RF output signal to generate a demodulated signal therefrom;
   circuitry for calculating corrections to the predistortion values stored in said predistortion LUT in accordance with values in the demodulated signals; and
   circuitry for applying a filter function to said corrections.

28. The apparatus according to claim 27, wherein said filter function comprises a moving average function.

29. The apparatus according to claim 27, wherein said filter function comprises an infinite impulse response (IIR) filter function.

30. The apparatus according to claim 27, wherein said filter function comprises an auto-regressive moving average (ARMA) filter function.

31. The apparatus according to claim 27, wherein said filter function comprises a threshold function that would determine whether the computed update exceeds a predefined magnitude.

32. The apparatus according to claim 27, wherein said range of codes are stepped through, corresponding correction values calculated and said predistortion LUT updated during a time wherein said transmit chain is inactive.

* * * * *